(12) United States Patent
Andoh

(10) Patent No.: US 6,507,469 B2
(45) Date of Patent: Jan. 14, 2003

(54) ELECTROSTATIC DISCHARGE PROTECTION CIRCUIT

(75) Inventor: Takeshi Andoh, Tokyo (JP)

(73) Assignee: NEC Corporation, Tokyo (JP)

( * ) Notice: Subject to any disclaimer, the term of this patent is extended or adjusted under 35 U.S.C. 154(b) by 26 days.

(21) Appl. No.: 09/880,034

(22) Filed: Jun. 14, 2001

(65) Prior Publication Data

US 2001/0053054 A1 Dec. 20, 2001

(30) Foreign Application Priority Data

Jun. 14, 2000 (JP) ........................................ 2000-178770

(51) Int. Cl.[7] ................................................ H02H 9/00
(52) U.S. Cl. ........................................ 361/56; 361/212
(58) Field of Search .............................. 361/54, 55, 56, 361/212, 220

(56) References Cited

U.S. PATENT DOCUMENTS 5,278,422 A * 1/1994 Kato et al.
RE35,836 E * 7/1998 Rodriguez
5,973,359 A * 10/1999 Kobayashi et al.

* cited by examiner

*Primary Examiner*—Edward H. Tso
(74) *Attorney, Agent, or Firm*—Sughrue Mion, PLLC

(57) ABSTRACT

In an electrostatic protection circuit of the present invention, a trigger voltage for causing snapback operation in MOSFET is reduced and circuit elements with low breakdown voltages can be protected. A protection nMOSFET having a drain connected to an input/output terminal and a source and a substrate that are grounded is provided. A diode array, composed of at least one diode, is connected in series in a forward direction between the gate of the protection nMOSFET and the input/output terminal. Finally, a resistor is connected between the gate of the protection nMOSFET and ground.

47 Claims, 16 Drawing Sheets

Connected to Internal Circuit Element

Connected to Internal Circuit Element

ELECTROSTATIC DISCHARGE PROTECTION CIRCUIT

BACKGROUND OF THE INVENTION

1. Field of the Invention

The present invention relates to a semiconductor integrated circuit, in particular an electrostatic discharge (ESD) protection circuit for preventing damage to an internal circuit element due to overvoltage from static electricity. The present application is based on Japanese Patent Application No. 178770/2000, which is incorporated herein by reference.

2. Description of the Related Art

FIG. 1 is a circuit diagram showing a conventional electrostatic protection circuit. FIG. 2 is a circuit diagram showing another conventional electrostatic protection circuit.

As shown in FIG. 1, the conventional electrostatic protection circuit comprises by N-channel MOSFET (hereinafter called nMOSFET) $Q_{n5}$ which is inserted between an input terminal IN connected to an internal circuit element to be protected and the ground GND. The drain (D) of nMOSFET $Q_{n5}$ is connected to the input terminal IN. The gate (G), the source (S) and the substrate (B) are grounded.

When a negative voltage is applied to the input terminal IN of the conventional electrostatic protection circuit, current flows from the ground GND to the input terminal IN via a PN junction between the substrate (B) and the drain (D) of nMOSFET $Q_{n5}$. Therefore, the negative overvoltage applied to the input terminal IN is clamped.

In the meantime, when a positive overvoltage is applied to the input terminal IN, current flow from the input terminal IN to the ground GND via the parasitic bipolar transistor of nMOSFET $Q_{n5}$. Therefore, the positive overvoltage applied to the input terminal IN is clamped. This is a phenomenon caused by the conduction of parasitic bipolar transistor composed of the source (S), the substrate (B) and the drain (D) of nMOSFET $Q_{n5}$ due to the voltage drop that occurs because of substrate resistance when a substrate current originated in impact ionization at the end of the drain flows. The phenomenon shows current (I)-voltage ($V_{in}$) characteristics having negative resistance called snapback as shown in FIG. 3.

Voltage $V_{t1}$ where a high-resistance region in charged to a low-resistance region due to the conduction of a parasitic bipolar transistor is called the trigger voltage. Normally, trigger voltage $V_{t1}$ is set to be lower than the breakdown voltage of a MOSFET of an internal circuit element (i.e., the breakdown voltage of a gate oxide film).

An electrostatic protection circuit shown in FIG. 2 includes P-channel MOSFET (hereinafter called pMOSFET) $Q_{p5}$ in addition to the electrostatic protection circuit shown in FIG. 1. The drain (D) of pMOSFET $Q_{p5}$ is connected to an input terminal IN. The gate (G), the source (S) and the substrate (B) of pMOSFET $Q_{p5}$ are connected to the power supply $V_{dd}$.

The electrostatic protection circuit shown in FIG. 2 is operated like the electrostatic protection circuit shown in FIG. 1 in the case that the power supply $V_{dd}$ is open. When the ground GND is open and a positive voltage exceeding the power supply $V_{dd}$ is applied to the input terminal IN, current flows from the input terminal IN to the power supply $V_{dd}$ via a PN junction between the drain (D) and the substrate (B) of pMOSFET $Q_{p5}$. Therefore, positive overvoltage applied to the input terminal IN is clamped.

On the other hand, when a negative overvoltage is applied to the input terminal IN, a parasitic bipolar transistor of pMOSFET $Q_{p5}$ conducts, and a current flows from the power supply $V_{dd}$ to the input terminal IN via the drain (D), the substrate (B) and the source (S) of pMOSFET $Q_{n5}$. Therefore, the negative overvoltage applied to the input terminal IN is clamped.

Thus, the breakdown of the internal circuit element of a semiconductor integrated circuit is prevented from overvoltage applied to the input terminal IN as described above.

Due to the scaling of semiconductor integrated circuits, the breakdown voltage has become relatively low. For example, for a MOSFET with a gate length of 0.35 μm, the thickness of a gate oxide film is 7 to 8 nm. For a MOSFET with a gate length of 0.25 μm, the thickness of the gate oxide film is 5 to 6 nm. For a MOSFET with a gate length of 0.18 μm, the gate oxide film is 3.5 to 4 nm. The breakdown voltage of the gate oxide film is approximately 15 MV/cm. Thus, for a MOSFET with a gate length of 0.35 μm, the breakdown voltage is approximately 10 to 12 V. For a MOSFET with a gate length of 0.25 μm, the breakdown voltage is approximately 7 to 9 V.

MOSFET with a gate length of 0.18 μm, the breakdown voltage is approximately 5 to 6 V.

Since overvoltage due to static electricity is transient, the gate oxide film may not be broken at once even if a voltage exceeding the breakdown voltage described above is applied. However, in that case, reliability may be deteriorated due to the variation of transistor characteristics.

As described above, the electrostatic protection circuits shown in FIG. 1 and FIG. 2 control the overvoltage by utilizing the MOSFET snapback current-voltage characteristics shown in FIG. 3. This is based on the fact that a resistance value of the parasitic bipolar transistor is smaller than a normal on-state resistance value of MOSFET.

As the breakdown voltage of the internal circuit element becomes lower, trigger voltage $V_{t1}$ must be a smaller value. However, as it is difficult to set trigger voltage $V_{t1}$ to desired voltage only by varying various parameters of a MOSFET, the trigger voltage $V_{t1}$ cannot be set to sufficiently low voltage. Therefore, it is difficult to protect an internal circuit element.

The present invention solves the problems that the electrostatic circuit of the related art described above has. One of the objects is to provide an electrostatic protection circuit wherein trigger voltage for causing the snapback operation of MOSFET is reduced and a circuit element having a low breakdown voltage can be protected.

SUMMARY OF THE INVENTION

In one aspect of the present invention, an electrostatic protection circuit is provided to prevent the breakdown of an internal circuit element of a semiconductor integrated circuit from overvoltage by static electricity. The electrostatic protection circuit comprises a protection nMOSFET in which the drain is connected to an input/output terminal and the source and the substrate are grounded. The electrostatic protection circuit further comprises a diode array, composed of at least one diode, connected in series in a forward direction between the gate of the protection nMOSFET and the input/output terminal. The electrostatic protection circuit further comprises a resistor connected between the gate of the protection nMOSFET and ground. The resistor is characterized in that the number of diodes composing the diode array and a value of the resistor are set so that the protection nMOSFET is kept off when voltage applied to the input-output terminal is between ground potential and supply voltage. The resistor is further characterized in that the nMOSFET is turned on and a parasitic bipolar transistor conducts when the voltage applied to the input/output terminal exceeds the supply voltage.

A second aspect of the present invention provides an electrostatic protection circuit comprising a protection nMOSFET, in which the drain is connected to an input/output terminal, and the source and the gate are grounded. The electrostatic protection circuit further comprises a diode array, composed of at least one diode, connected in series in a forward direction between the substrate of the protection nMOSFET and the input-output terminal. The electrostatic protection circuit further comprises a resistor connected between the substrate of the protection nMOSFET and ground. The resistor is characterized in that the number of diodes composing the diode array and a value of the resistor are set so that the protection nMOSFET is kept off when voltage applied to the input/output terminal is between ground potential and supply voltage. The resistor is further characterized such that current flows from the substrate of the protection nMOSFET to the source and a parasitic bipolar transistor conducts when voltage applied to the input/output terminal exceeds the supply voltage.

It is desirable that the resistor is a nMOSFET set to an off state.

A third aspect of the present invention provides an electrostatic protection circuit comprising a protection nMOSFET in which the drain is connected to an input/output terminal, and the source and the substrate are grounded. The electrostatic protection circuit further comprises a diode array, composed of at least one diode, connected in series in a forward direction between the gate of the protection nMOSFET and the input/output terminal. The electrostatic protection circuit further comprises a first resistor connected in parallel with the diode array between the gate of the protection nMOSFET and the input-output terminal. The electrostatic protection circuit further comprises a second resistor connected between the gate of the protection nMOSFET and the ground. Each value of the first resistor and the second resistor is set so that the protection nMOSFET is kept off when voltage applied to the input/output terminal is between ground potential and supply voltage. The number of diodes composing the diode array and a value of the second resistor are set so that the protection nMOSFET is turned on and a parasitic bipolar transistor conducts when voltage applied to the input/output terminal exceeds the supply voltage.

A fourth aspect of the present invention provides an electrostatic protection circuit comprising a protection nMOSFET in which the drain is connected to an input/output terminal, and the source and the gate are grounded. The electrostatic protection circuit also comprises a diode array, composed of at least one diode, connected in series in a forward direction between the substrate of the protection nMOSFET and the input/output terminal. The electrostatic protection circuit further comprises a first resistor connected in parallel with the diode array between the substrate of the protection nMOSFET and the input/output terminal and a second resistor connected between the substrate of the protection nMOSFET and the ground. Each value of the first resistor and the second resistor is set so that the protection nMOSFET is kept off when voltage applied to the input/output terminal is between ground potential and supply voltage. The number of diodes composing the diode array and a value of the second resistor are set so that current flows from the substrate of the protection nMOSFET to the source and a parasitic bipolar transistor conducts when voltage applied to the input/output terminal exceeds the supply voltage.

It is desirable that the first resistor and the second resistor are nMOSFETs set to an off state.

A fifth aspect of the present invention provides an electrostatic protection circuit comprising a protection pMOSFET in which the drain is connected to an input/output terminal and the source and the substrate are connected to a power supply. The electrostatic protection circuit further comprises a diode array, composed of at least one diode, connected in series in a forward direction between the gate of the protection pMOSFET and the input/output terminal. The electrostatic protection circuit further comprises a resistor connected between the gate of the protection pMOSFET and the power supply. The resistor is characterized in that the number of diodes composing the diode array and a value of the resistor are set so that the protection pMOSFET is kept off when voltage applied to the input/output terminal is between ground potential and supply voltage. The resistor is further characterized in that the protection pMOSFET is turned on and a parasitic bipolar transistor conducts when voltage applied to the input/output terminal is less than the ground potential.

A sixth aspect of the present invention provides an electrostatic protection circuit comprising a protection pMOSFET in which the drain is connected to an input/output terminal, and the source and the gate are connected to a power supply. The electrostatic protection circuit further comprises a diode array, composed of at least one diode, connected in series in a forward direction between the substrate of the protection pMOSFET and the input/output terminal. The electrostatic protection circuit further comprises a resistor connected between the substrate of the protection pMOSFET and the power supply. The resistor is characterized in that the number of diodes composing the diode array and a value of the resistor are set so that the protection pMOSFET is kept off when voltage applied to the input/output terminal is between ground potential and supply voltage. The resistor is further characterized in that current flows from the source of the protection pMOSFET to the substrate and a parasitic bipolar transistor conducts when voltage applied to the input/output terminal is less than the ground potential.

It is desirable that the resistor is a pMOSFET set to an off state.

A seventh aspect of the present invention provides an electrostatic protection circuit comprising a protection pMOSFET in which the drain is connected to an input/output terminal, and the source and the substrate are connected to a power supply. The electrostatic protection circuit further comprises a diode array, composed of at least one diode, connected in series in a forward direction between the gate of the protection pMOSFET and the input/output terminal. The electrostatic protection circuit further comprises a first resistor connected in parallel with the diode array between the gate of the protection pMOSFET and the input/output terminal. The electrostatic protection circuit further comprises a second resistor connected between the gate of the protection pMOSFET and power supply. The value of the first resistor and the second resistor is set so that the protection pMOSFET is kept off when voltage applied to the input-output terminal is between ground potential and supply voltage. The number of diodes composing the diode array and the value of the second resistor are set so that the protection pMOSFET,T is turned on and a parasitic bipolar transistor conducts when voltage applied to the input/output terminal is less than the ground potential.

An eighth aspect of the present invention provides an electrostatic protection circuit comprising protection pMOSFET in which the drain is connected to an input/output terminal, and the source and the gate are connected to a power supply. The electrostatic protection circuit further comprises a diode array, composed of at least one diode, connected in series in a forward direction between the substrate of the protection pMOSFET and the input/output terminal. The electrostatic protection circuit further comprises a first resistor connected in parallel with the diode array between the substrate of the protection pMOSFET and the input/output terminal. The electrostatic protection circuit further comprises a second resistor connected between the substrate of the protection pMOSFET and power supply. The value of the first resistor and the second resistor are set so that the protection pMOSFET is kept off when voltage applied to the input/output terminal is between ground potential and supply voltage. The number of diodes composing the diode array and the value of the second resistor are set so that current flows from the source of the protection pMOSFET to the substrate and a parasitic bipolar transistor conducts when voltage applied to the input/output terminal is less than the ground potential.

It is desirable that the first resistor and the second resistor are pMOSFETs set to an off state.

Furthermore, the nMOSFET, the diode array and the resistor connected to the protection nMOSFET and the pMOSFET, the diode array and the resistor connected to the protection pMOSFET can be combined.

In the electrostatic protection circuit described above, when the voltage applied to the input/output terminal exceeds supply voltage or is less than ground potential, the substrate current of the protection nMOSFET or the protection pMOSFET increases and trigger voltage for snapback can be reduced.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION (First Embodiment)

Figure 1:
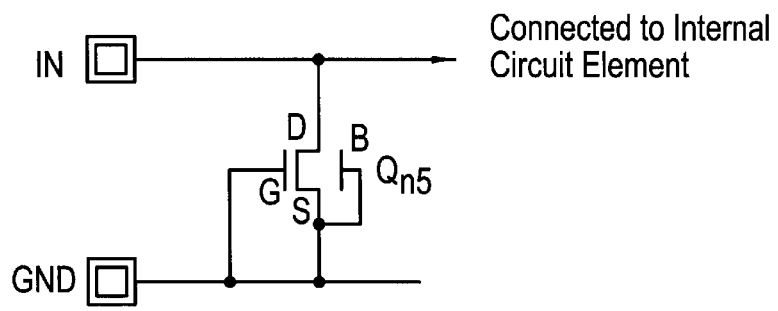
FIG. 1 is a circuit diagram showing a conventional electrostatic protection circuit.
Figure 2:
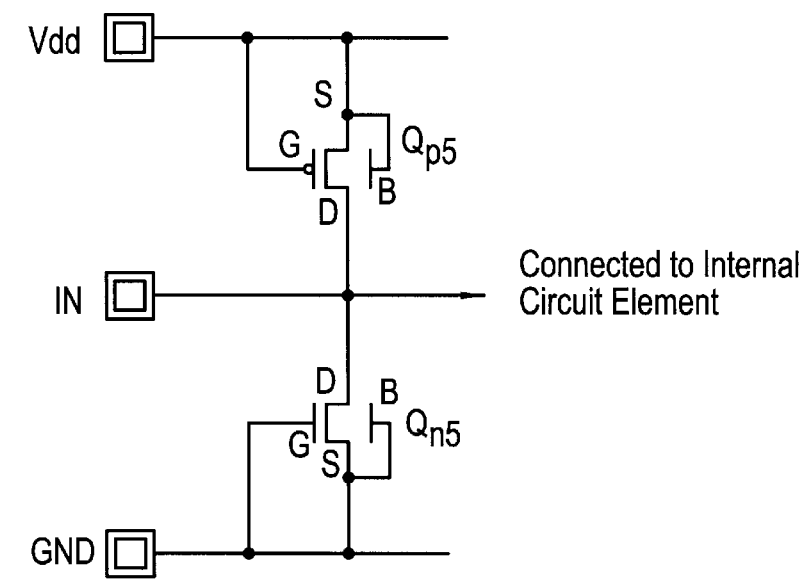
FIG. 2 is a circuit diagram showing another a conventional electrostatic protection circuit.
Figure 3:
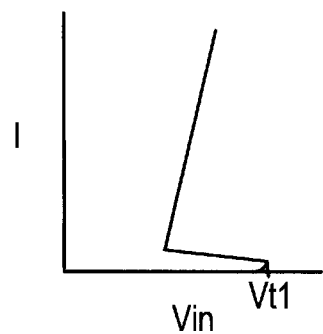
FIG. 3 is a graph showing relationship between input voltage $V_{in}$ and the current that flows in the protection MOSFET in a conventional electrostatic protection circuit.
Figure 4:
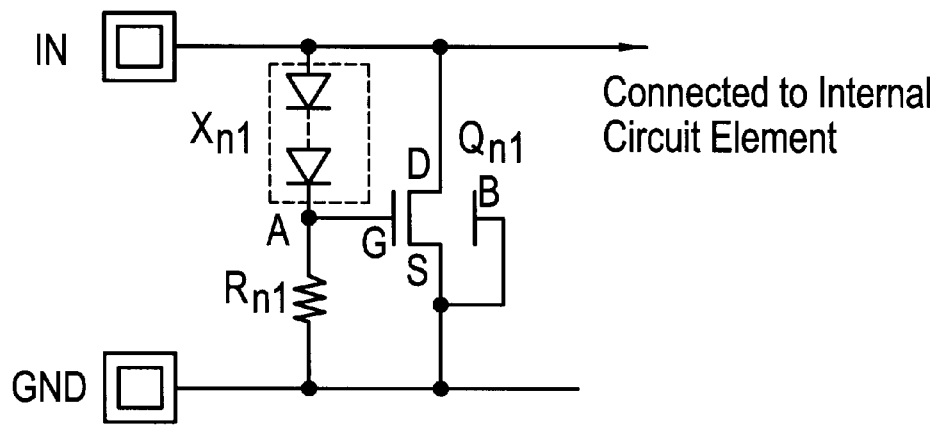
FIG. 4 is a circuit diagram showing a first embodiment of an electrostatic protection circuit according to the present invention.
Figure 5:
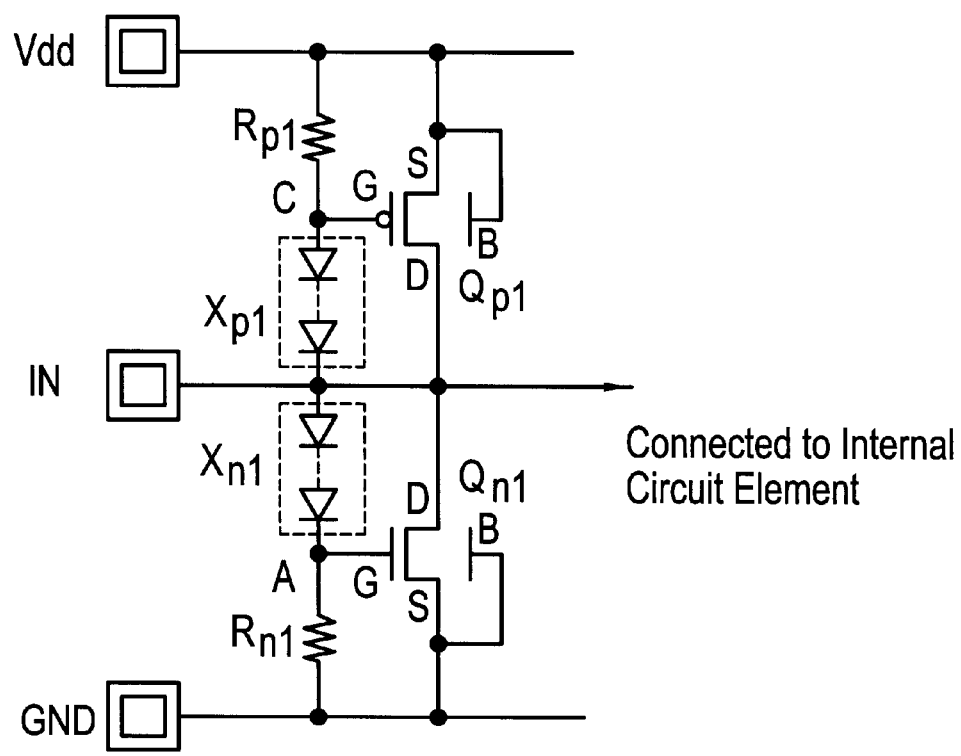
FIG. 5 is a circuit diagram showing another configuration of the first embodiment of the electrostatic protection circuit according to the present invention.

FIG. 4 is a circuit diagram showing a first embodiment of an electrostatic protection circuit according to the present invention. FIG. 5 is a circuit diagram showing another configuration of the first embodiment of the electrostatic protection circuit according to the present invention.

As shown in FIG. 4, the electrostatic protection circuit of this embodiment is provided with protection nMOSFET $Q_{n1}$ in which the drain (D) is connected to an input terminal IN and to an internal circuit element to be protected, and the source (S) and the substrate (B) are grounded. A diode array $X_{n1}$, composed of at least one diode, is connected in series in a forward direction between the gate (G) of the protection nMOSFET $Q_{n1}$ and the input terminal IN. A resistor $R_{n1}$ is connected between the gate (G) of the protection nMOSFET $Q_{n1}$ and the ground GND.

The electrostatic protection circuit shown in FIG. 5 is provided with protection pMOSFET $Q_{p1}$ in which a drain (D) is connected to an input terminal IN and an internal circuit element to be protected. The source (S) and substrate (B) are connected to a power supply $V_{dd}$. A diode array $X_{p1}$, composed of at least one diode, is connected in series in a forward direction between the gate (G) of the protection pMOSFET $Q_{p1}$ and the input terminal IN. A resistor $R_{p1}$ is connected between the gate (G) of the protection pMOSFET $Q_{p1}$ and the power supply $V_{dd}$ in addition to the electrostatic protection circuit shown in FIG. 4.

Figure 6:
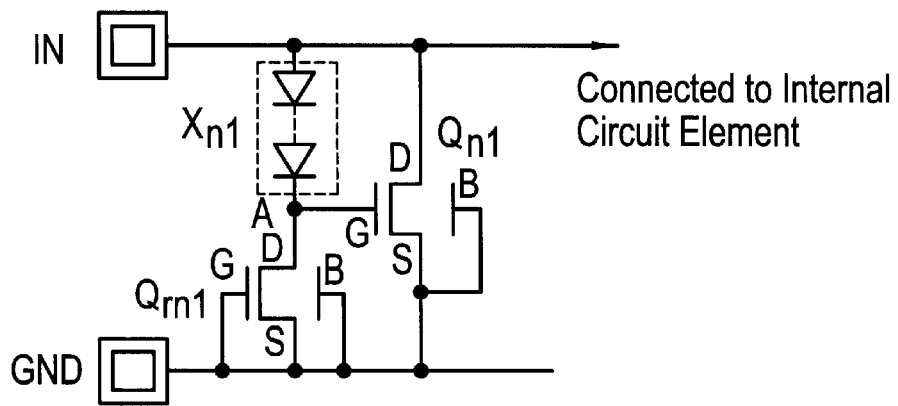
FIG. 6 is a circuit diagram showing another example of the electrostatic protection circuit shown in FIG. 4.
Figure 7:
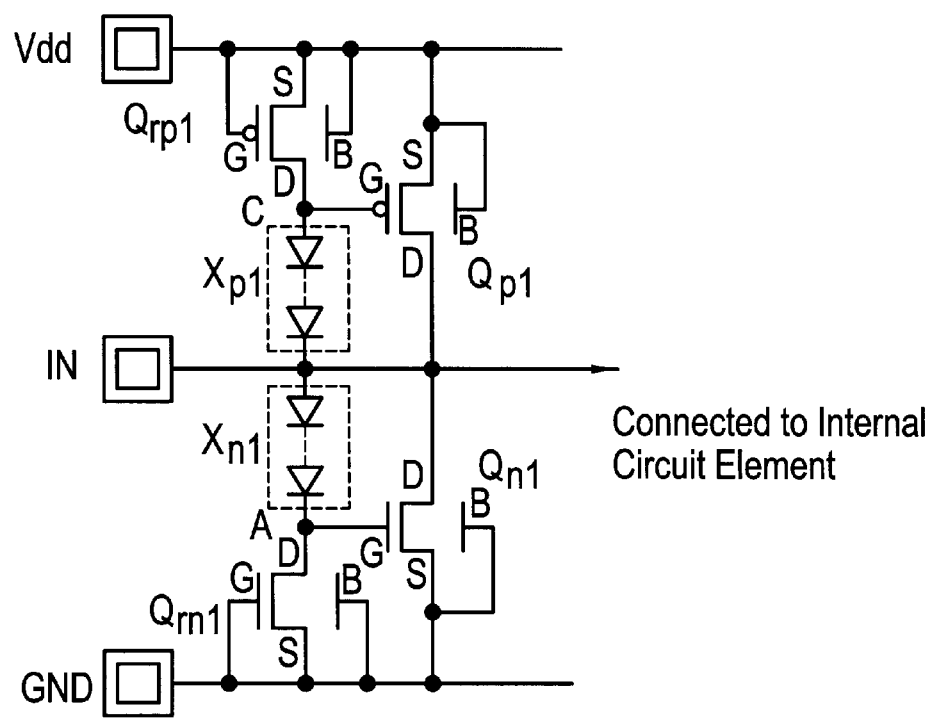
FIG. 7 is a circuit diagram showing another example of the electrostatic protection circuit shown in FIG. 5.

FIG. 6 is a circuit diagram showing another example of the electrostatic protection circuit shown in FIG. 4. FIG. 7 is a circuit diagram showing another example of the electrostatic protection circuit shown in FIG. 5.

As shown in FIG. 6, the resistor $R_{n1}$ of the electrostatic protection circuit shown in FIG. 4 can be replaced with nMOSFET $Q_{rn1}$. The drain (D) of the nMOSFET $Q_{rn1}$ is connected to the gate (G) of the protection nMOSFET $Q_{n1}$ and the source (S), the gate (G) and the substrate (B) of the nMOSFET $Q_{rn1}$ are grounded.

As shown in FIG. 7, the resistor $R_{n1}$ of the electrostatic protection circuit shown in FIG. 5 can be replaced with pMOSFET $Q_{rn1}$. The drain (D) of the pMOSFET $Q_{rn1}$ is connected to the gate (G) of the protection pMOSFET $Q_{p1}$, and the source (S), the gate (G) and the substrate (B) of the pMOSFET $Q_{rp1}$ are connected to a power supply $V_{dd}$. The resistor $R_{n1}$ shown in FIG. 7 can be also replaced with nMOSFET $Q_{rn1}$ as in FIG. 6.

The operation of the electrostatic protection circuit will be described below by using the circuits shown in FIG. 6 and FIG. 7 as examples.

In FIG. 6, when input voltage $V_{in}$ is applied to the input terminal IN, the electric potential $V_a$ at a connection node A of the diode array $X_{n1}$ and the drain of nMOSFET $Q_{rn1}$ has a value acquired by dividing input voltage $V_{in}$ by the resistance in a forward direction of the diode array $X_{n1}$ and the off-state resistance of the nMOSFET $Q_{rn1}$.

The resistance in the forward direction of the diode array $X_{n1}$ is high (e.g., approximately $10^{14}$ $\Omega$) when the input voltage $V_{in}$ is lower than the product ($k \times V_f$) of the number k of diodes in the diode array $X_{n1}$ and the forward voltage $V_f$ of the diode. On the other hand, the resistance is low (e.g., approximately 100 $\Omega$) when the input voltage $V_{in}$ is higher than the product ($k \times V_f$). In the meantime, a value of the off-state resistance of the nMOSFET $Q_{rn1}$ can be regarded as substantially constant (e.g., approximately $10^{10}$ $\Omega$) because the nMOSFET only slightly depends upon the input voltage $V_{in}$ until a parasitic bipolar transistor conducts.

Figure 8:
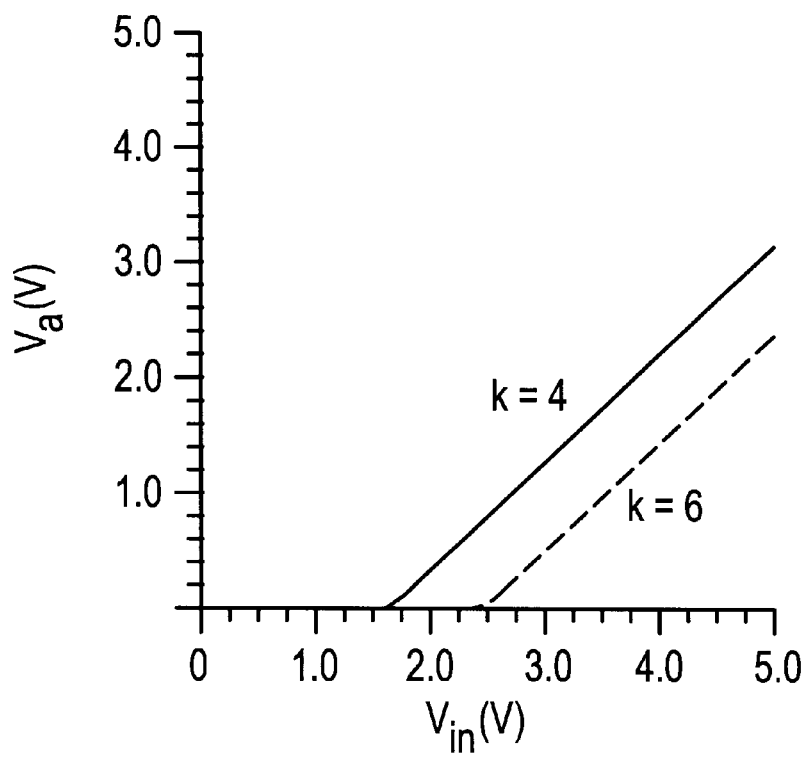
FIG. 8 is a graph showing relationship between input voltage $V_{in}$ and voltage $V_a$ at a node A.

Therefore, the electric potential $V_a$ at the node A is substantially equal to ground potential GND when the input voltage $V_{in}$ is lower than the product ($k \times V_f$) of the number k of diodes and the forward voltage $V_f$ of the diode. On the other hand, when the input voltage $V_{in}$ is higher than the product ($k \times V_f$), the electric potential $V_a$ increases together with the input voltage $V_{in}$, as shown in FIG. 8. FIG. 8 shows cases in which the number k of diodes in the diode array $X_{n1}$ is 4 (shown by a full line) and is 6 (shown by a dotted line).

In this embodiment, the number k of diodes in the diode array $X_{n1}$ and the off-state resistance value which is controlled by (the threshold voltage) of the nMOSFET $Q_{rn1}$ are set so that when input voltage $V_{in}$ exceeds supply source voltage $V_{dd}$, voltage exceeding threshold voltage $V_{th}$ is applied to the gate of the protection nMOSFET $Q_{n1}$ and the nMOSFET is turned on. In FIG. 8, the supply voltage $V_{dd}$ is set to 1.0 V (k=4) and 1.8 V (k=6).

Figure 9:
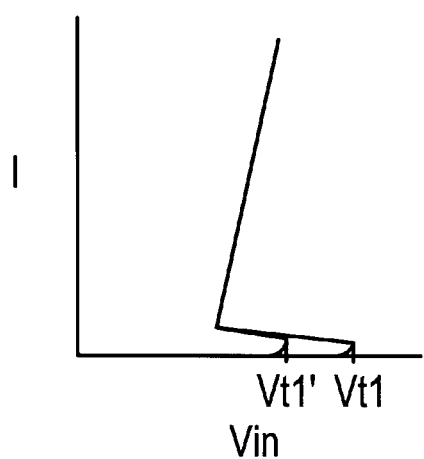
FIG. 9 is a graph showing relationship between input voltage $V_{in}$ and current that flows in the protection MOSFET.

In the electrostatic protection circuit shown in FIG. 6, when input voltage $V_{in}$ is in a normal region ($0 \leq V_{in} \leq V_{dd}$), the protection nMOSFET $Q_{n1}$ is kept off. When input voltage $V_{in}$ is in an abnormal region ($V_{in} > V_{dd}$), the protection nMOSFET $Q_{n1}$ is turned on. As channel current flows and impact ionization is accelerated when the protection nMOSFET $Q_{n1}$ is turned on, substrate current also increases. Therefore, trigger voltage $V_{t1}$ for snapback is reduced (down to $V_{t1}$) as shown in FIG. 9.

Since the trigger voltage $V_{t1}$ can be set to desired voltage (low voltage) by adjusting the number k of diodes in the diode array $X_{n1}$ or the off-state resistance value (which is controlled by the threshold voltage) of the nMOSFET $Q_{rn1}$, the breakdown of an internal circuit element with a low breakdown voltage can be prevented.

When negative voltage is applied to the input terminal IN shown in FIG. 4 or FIG. 6, current flows from the ground GND to the input terminal IN via a PN junction between the drain (D) and the substrate (B) of the nMOSFET $Q_n$ as in the related art. Therefore, negative overvoltage applied to the input terminal IN is clamped.

In the meantime, the electrostatic protection circuit shown in FIG. 7 is operated as the electrostatic protection circuit shown in FIG. 6 in the case that the power supply $V_{dd}$ is open. In the case that the ground GND is open, when positive voltage exceeding the power supply $V_{dd}$ is applied to the input terminal IN, current flows from the input terminal IN to the power supply $V_{dd}$ via a PN junction between the drain (D) and the substrate (B) of the protection pMOSFET $Q_{p1}$. Therefore, positive overvoltage applied to the input terminal IN is clamped.

If the number k of diodes in the diode array $X_{p1}$ and the off-state resistance value (which is controlled by the threshold voltage) of the pMOSFET $Q_{rp1}$ are set so that the protection pMOSFET $Q_{p1}$ is turned on when input voltage $V_{in}$ is less than the ground potential GND in the electrostatic protection circuit shown in FIG. 6, the protection pMOSFET $Q_{p1}$ is kept off when input voltage $V_{in}$ is in a normal region ($0 \leq V_{in} \leq V_{dd}$) and the protection pMOSFET $Q_{p1}$ is turned on when input voltage $V_{in}$ is in an abnormal region ($V_{in} < 0$). Therefore, as in the protection nMOSFET $Q_{n1}$ shown in FIG. 6, channel current flows, substrate current also increases because impact ionization is accelerated. As a result, trigger voltage $V_{t1}$ for snapback is reduced.

Therefore, as in the electrostatic protection circuit shown in FIG. 4, not only trigger voltage $V_{t1}$) for a parasitic bipolar transistor of the protection nMOSFET $Q_{n1}$ but trigger voltage $V_{t1}$ for a parasitic bipolar transistor of the protection pMOSFET $Q_{p1}$ can be reduced, positive and negative overvoltage applied to the input terminal IN can be clamped even if either of the power supply $V_{dd}$ or the ground GND is open.

Although the configuration provided with both the protection nMOSFET $Q_{n1}$ and the protection pMOSFET $Q_{p1}$ is shown in the electrostatic protection circuits shown in FIGS. 5 and 7, the electrostatic protection circuits may be also provided with only the protection pMOSFET $Q_{p1}$, the diode array $X_{p1}$ and the resistor $R_{p1}$ (or the pMOSFET $Q_{rp1}$). As trigger voltage $V_{t1}$ for a parasitic bipolar transistor of the protection pMOSFET $Q_{p1}$ can also be reduced in such configuration, negative overvoltage applied to the input terminal IN can be clamped when the ground GND is open.

Next, referring to the FIG. 10 and FIG. 11, the structure of the electrostatic protection circuit of this embodiment will be described.

Figure 10:
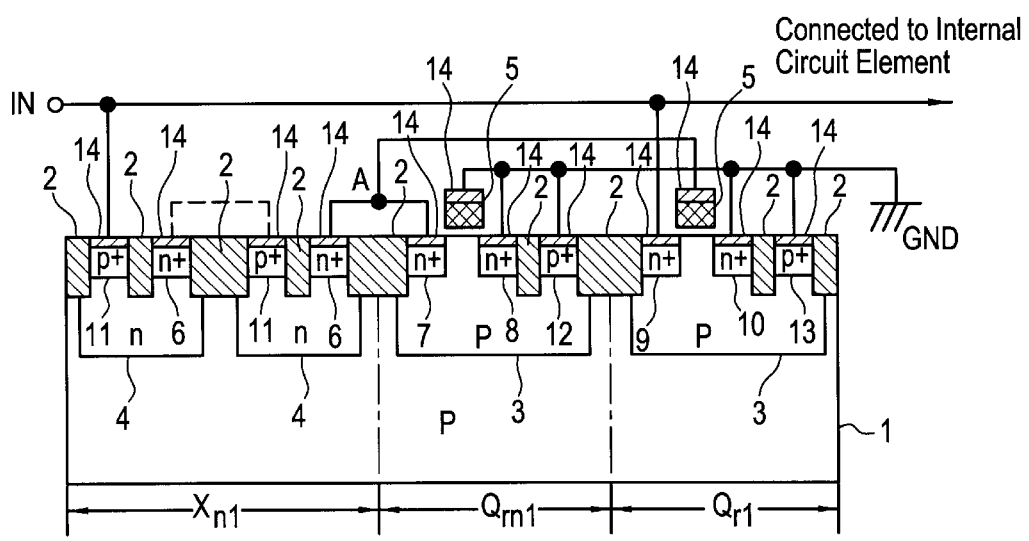
FIG. 10 is a cross sectional view of the electrostatic protection circuit, shown in FIG. 6, formed on a silicon substrate.

FIG. 10 is a cross sectional view of the electrostatic protection circuit, shown in FIG. 6, formed on a silicon substrate. FIG. 11 is a cross sectional view of the electrostatic protection circuit, shown in FIG. 7, formed on a silicon substrate. In FIG. 10, two diodes are shown as the diode array $X_{n1}$. FIG. 11 shows the structure of only the protection pMOSFET $Q_{p1}$, the diode array $X_{p1}$ (comprising two diodes) and the pMOSFET $Q_{rp1}$ in the electrostatic protection circuit shown in FIG. 7. As the structure of the protection nMOSFET $Q_{n1}$, the diode array $X_{n1}$ and the nMOSFET $Q_{rn1}$ is similar to FIG. 10, the description is omitted.

As shown in FIG. 10, the electrostatic protection circuit shown in FIG. 6 is first formed by forming a field oxide firm 2 approximately 400 nm thick in a p-type substrate 1 and implanting boron into an nMOSFET formation region by $2 \times 10^{13}$ cm$^{-2}$ at 300 keV, by $4 \times 10^{12}$ cm$^{-2}$ at 200 keV and by $5 \times 10^{12}$ cm$^{-2}$ at 30 keV continuously by using photoresist as a mask so as to form a p-type well 3.

Next, to form an n-type well 4, phosphorus is implanted into each diode formation region of the diode array $X_{n1}$ by $2 \times 10^{13}$ cm$^{-2}$ at 700 keV and by $4 \times 10^{12}$ cm at 500 keV and further, arsenic is implanted by $5 \times 10^{12}$ cm$^{-2}$ at 100 keV by using photoresist as a mask.

Next, a gate oxide film approximately 3.5 nm thick is formed on the p-type substrate 1 and a gate electrode 5 made of polycrystalline silicon and having the thickness of 150 nm and the width of 0.18 μm is formed on the gate oxide film.

Next, after an n diffusion layer (not shown) to be a portion of a source and a drain is formed by implanting arsenic into an nMOSFET formation region by $3 \times 10^{14}$ cm$^{-2}$ at 10 keV by using the gate electrode 5 as a mask, a gate side wall (not shown) made of an oxide film approximately 100 nm wide is formed on the side of the gate electrode 5.

Next, n$^+$ diffusion layers 6 to 10 are formed b implanting arsenic into an nMOSFET formation region and a diode formation region by $3 \times 10^{15}$ cm$^{-2}$ at 50 keV by using photoresist, the gate electrode 5 and the gate side wall as a mask. The n$^+$ diffusion layer 6 is the cathode of each diode composing the diode array $X_{n1}$, the n$^+$ diffusion layer 7 is the drain (D) of the nMOSFET $Q_{rn1}$, the n$^+$ diffusion layer 8 is the source (S) of the nMOSFET $Q_{rn1}$, the n$^+$ diffusion layer 9 is the drain (D) of the protection nMOSFET $Q_{n1}$ and the n$^+$ diffusion layer 10 is the source (S) of the protection nMOSFET $Q_{n1}$.

Next, p$^+$ diffusion layers 11 to 13 are formed by implanting boron difluoride (BF$_2$) into a diode formation region and an nMOSFET formation region by $3 \times 10^{15}$ cm$^{-2}$ at 30 keV using photoresist as a mask. The p$^+$ diffusion layer 11 is the anode of each diode composing the diode array $X_{n1}$, the p$^+$ diffusion layer 12 is a p-type well contact for the nMOSFET $Q_{rn1}$ and the p$^+$ diffusion layer 13 is a p-type well contact for the protection nMOSFET $Q_{n1}$.

Finally, after a cobalt silicide layer 14 having the thickness of 30 nm is formed on each surface of the gate electrode 5, the n$^+$ diffusion layers 6 to 10 and the p$^+$ diffusion layers 11 to 13 and a passivation film (not shown) are formed. Wiring is made on each cobalt silicide layer 14.

Figure 11:
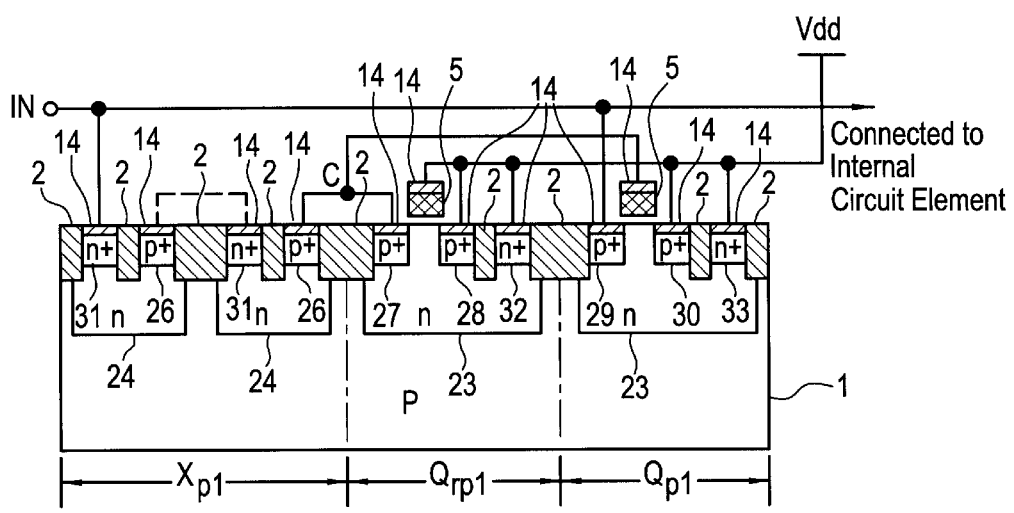
FIG. 11 is a cross sectional view of the electrostatic protection circuit, shown in FIG. 7, formed on a silicon substrate.

As shown in FIG. 11, the electrostatic protection circuit shown in FIG. 7 is first formed by forming a field oxide film 2 approximately 400 nm thick in the p-type substrate 1, and implanting phosphorus into each diode formation region of the diode array $X_{p1}$ and a pMOSFET formation region by $2 \times 10^{13}$ cm$^{-2}$ at 700 keV and by $4 \times 10^{12}$ cm$^{-2}$ at 500 keV and further, implanting arsenic by $5 \times 10^{12}$ cm$^{-2}$ at 100 keV by using photoresist as a mask so as to form n-type wells 24 and 23 (formed at the same time as the n-type well 4 shown in FIG. 10).

Next, a gate oxide film approximately 3.5 nm thick is formed on the p-type substrate 1 and a gate electrode 5 made of polycrystalline silicon and having the thickness of 150 nm and the width of 0.18 μm is formed on the gate oxide film.

Next, after a p$^-$ diffusion layer (not shown) to be a portion of a source and a drain is formed by implanting boron difluoride (BF$_2$) into a pMOSFET formation region by $3 \times 10^{14}$ cm$^{-2}$ at 10 keV by using the gate electrode 5 as a mask, a gate side wall (not shown) made of an oxide film approximately 100 nm wide is formed on the side of the gate electrode 5.

Next, n$^+$ diffusion layers 31–33 are formed by implanting arsenic into a pMOSFET formation region and a diode formation region by $3 \times 10^{15}$ cm$^{-2}$ at 50 keV by using photoresist, the gate electrode 5 and the gate side wall as a mask (formed at the same time as the n$^+$ diffusion layers 6 to 10 shown in FIG. 10). The n$^+$ diffusion layer 31 is the cathode of each diode composing the diode array $X_{p1}$, the n$^+$ diffusion layer 32 is an n-type well contact for the pMOSFET $Q_{rm1}$ and the n$^+$ diffusion layer 33 is an n-type well contact for the protection pMOSFET $Q_{p1}$.

Next, p$^+$ diffusion layers 26–30 (formed at the same time as the p$^+$ diffusion layers 11–13 shown in FIG. 10) are formed by implanting boron difluoride (BF$_2$) into a diode formation region and a pMOSFET formation region by $3 \times 10^{15}$ cm$^{-2}$ at 30 keV by using photoresist as a mask. The p$^+$ diffusion layer 26 is the anode of each diode composing the diode array $X_{p1}$, the p$^+$ diffusion layer 27 is the drain (D) of the pMOSFET $Q_{p1}$, the p$^+$ diffusion layer 28 is the source (S) of the pMOSFET $Q_{rp1}$, the p$^+$ diffusion layer 29 is the drain (D) of the protection pMOSFET $Q_{p1}$ and the p$^+$ diffusion layer 30 is the source (S) of the protection pMOSFET $Q_{p1}$.

Finally, after a cobalt silicide layer 14 having the thickness of 30 nm is formed on the surface of the gate electrode 5, the p$^+$ diffusion layers 26 to 30 and the n$^+$ diffusion layers 31–33 and a passivation film (not shown) are formed. Wiring is made on each cobalt silicide layer 14.

As each diode composing the diode arrays $X_{n1}$ and $X_{p1}$ can be formed in a common process with the protection nMOSFET $Q_{n1}$ and nMOSFET $Q_{rn1}$ or the protection pMOSFET $Q_{p1}$ and pMOSFET $Q_{rp1}$ in this embodiment, the electrostatic protection circuit according to the present invention can be formed without increasing process steps, as compared with the structure of the related art.

(Second Embodiment)

Figure 12:
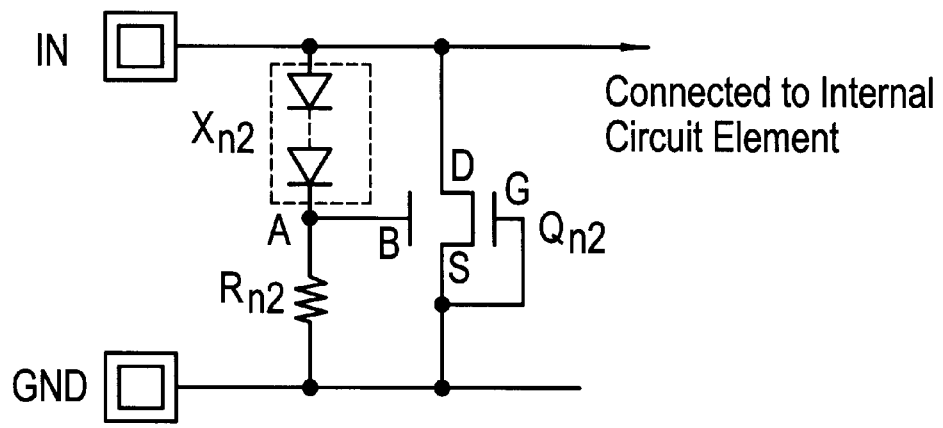
FIG. 12 is a circuit diagram showing a second embodiment of the electrostatic protection circuit according to the present invention.
Figure 13:
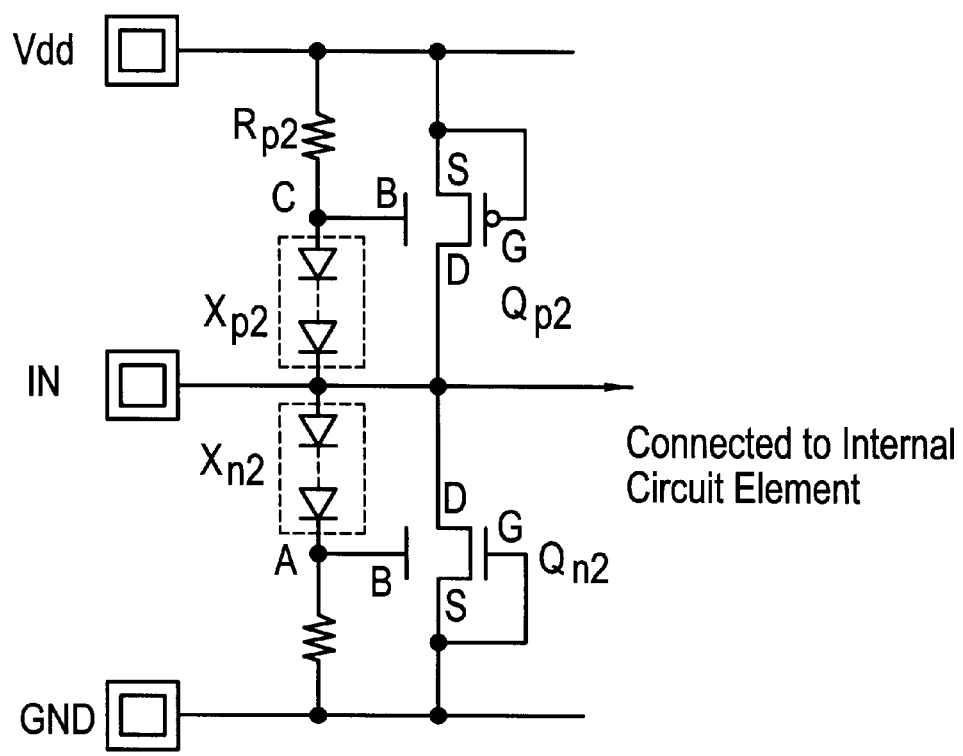
FIG. 13 is a circuit diagram showing another configuration of the second embodiment of the electrostatic protection circuit according to the present invention.

FIG. 12 is a circuit diagram showing the configuration of a second embodiment of the electrostatic protection circuit according to the present invention. FIG. 13 is a circuit diagram showing another configuration of the second embodiment of the electrostatic protection circuit according to the present invention.

As shown in FIG. 12, an electrostatic protection circuit of this embodiment is provided with protection nMOSFET $Q_n$ in which the drain (D) is connected to an input terminal IN and to an internal circuit element to be protected. The source (S) and the gate (G) are grounded. A diode array $X_{n2}$, composed of at least one diode, is connected in series in a forward direction between the substrate (B) of the protection nMOSFET $Q_{n2}$ and the input terminal IN. A resistor $R_{n2}$ is connected between the substrate (B) of the protection nMOSFET $Q_{n2}$ and the ground.

The electrostatic protection circuit shown in FIG. 13 is provided with protection pMOSFET $Q_{p2}$, in which the drain (D) is connected to an input terminal IN and to an internal circuit element to be protected. The source (S) and the gate (G) are connected to a power supply $V_{dd}$. A diode array $X_{p2}$, composed of at least one diode, is connected in series in a forward direction between the substrate (B) of the protection pMOSFET $Q_{p2}$ and the input terminal IN. A resistor $R_{p2}$ is connected between the substrate (B) of the protection pMOSFET $Q_{p2}$ and the power supply $V_{dd}$ in addition to the electrostatic protection circuit shown in FIG. 12.

Figure 14:
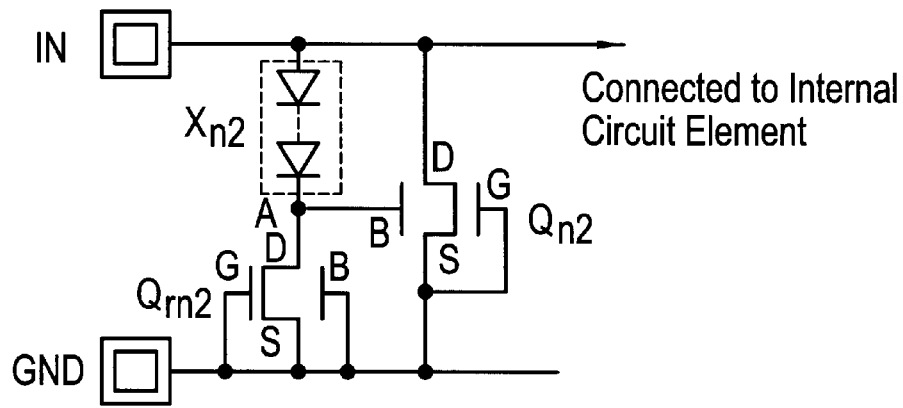
FIG. 14 is a circuit diagram showing another example of the electrostatic protection circuit shown in FIG. 12.
Figure 15:
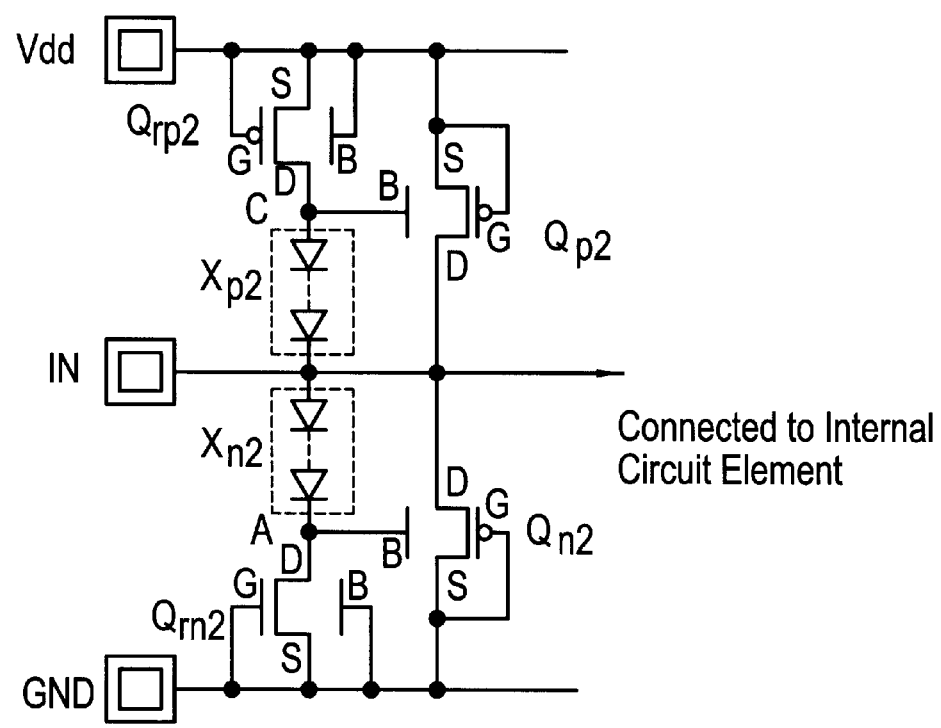
FIG. 15 is a circuit diagram showing another example of the electrostatic protection circuit shown in FIG. 13.

FIG. 14 is a circuit diagram showing another example of the electrostatic protection circuit shown in FIG. 12. FIG. 15 is a circuit diagram showing another example of the electrostatic protection circuit shown in FIG. 13.

As shown in FIG. 14, the resistor $R_{n2}$ of the electrostatic protection circuit shown in FIG. 12 can be replaced with nMOSFET $Q_{rn2}$ as in the first embodiment. The drain (D) of the nMOSFET $Q_{rn2}$ is connected to the substrate (B) of protection nMOSFET $Q_{n2}$. The source (S), the gate (G) and the substrate (B) of the nMOSFET $Q_{rn2}$ are grounded.

Also, as shown in FIG. 15, the resistor $R_{p2}$ of the electrostatic protection circuit shown in FIG. 13 can be replaced with pMOSFET $Q_{rp2}$ as in the first embodiment. The drain (D) of the pMOSFET $Q_{rp2}$ is connected to the substrate (B) of protection pMOSFET $Q_{p2}$, and the source (S), the gate (G) and the substrate (B) of the pMOSFET $Q_{rp2}$ are connected to a power supply $V_{dd}$. A resistor $R_{n2}$ shown in FIG. 15 can be also replaced with the nMOSFET $Q_{rn2}$ as in FIG. 14.

Next, referring to the circuits shown in FIG. 14 and FIG. 12, the operation of the electrostatic protection circuit of this embodiment will be described.

As shown in FIG. 14, as the diode array $X_{n2}$ and the nMOSFET $Q_{rn2}$ of the electrostatic protection circuit of this embodiment have the similar configuration to the diode array $X_{n1}$ and the nMOSFET $Q_{rn1}$ in the first embodiment, electric potential $V_a$ at a node A is substantially equal to ground potential GND when input voltage $V_{in}$ is lower than the product ($k \times V_f$) of the number k of diodes in the diode array $X_{n2}$ and voltage $V_f$ of the diode and increases with input voltage $V_{in}$ when the input voltage $V_{in}$ is higher than the product ($k \times V_f$).

In this embodiment, the number k of diodes in the diode array $X_{n2}$ and an off-state resistance value (which is controlled by the threshold voltage) of the nMOSFET $Q_{rn2}$ are set so that forward current flows across a PN junction of the substrate (B) and the source (S) of the protection nMOSFET $Q_{n2}$ when input voltage $V_{in}$ exceeds source voltage $V_{dd}$.

In the electrostatic protection circuit shown in FIG. 14, by setting as described above, when input voltage $V_{in}$ is in a normal region ($0 \leq V_{in} \leq V_{dd}$), the protection nMOSFET $Q_{n2}$ is kept off and when input voltage $V_{in}$ is in an abnormal region ($V_{in} > V_{dd}$), forward current flows across the PN junction of the substrate (B) and the source (S) of the protection nMOSFET $Q_{n2}$. Therefore, the forward current reduces the trigger voltage $V_{t1}$ for snapback.

In the meantime, the electrostatic protection circuit shown in FIG. 15 is operated as the electrostatic protection circuit shown in FIG. 14 in the care that the power supply $V_{dd}$ is open. In the care that the ground GND is open, the number k of diodes in the diode array $X_{p2}$ and an off-state resistance value (which is controlled by the threshold voltage) of the pMOSFET $Q_{rp2}$ are set as in the electrostatic protection circuit shown in FIG. 14 so that forward current flows across the PN junction between the substrate (B) and the source (S) of the protection pMOSFET $Q_{p2}$ when input voltage $V_{in}$ is less than ground potential GND.

By setting as described above, when input voltage $V_{in}$ is in a normal region ($0 \leq V_{in} \leq V_{dd}$), the protection pMOSFET $Q_{p2}$ is kept off and when input region $V_{in}$ is abnormal voltage ($V_{in} < 0$), forward current flows across the PN junction of the substrate (B) and the source (S) of the protection pMOSFET $Q_{p2}$. Therefore, the forward current reduces the trigger voltage $V_{t1}$ for snapback.

As a result, the similar effect to that in the electrostatic protection circuit of the first embodiment can be also acquired in the electrostatic protection circuit of this embodiment.

Although, the electrostatic protection circuits shown in FIG. 13 and FIG. 15 are provided with the protection nMOSFET $Q_{n2}$ and the protection pMOSFET $Q_{p2}$, they may be provided with only the protection pMOSFET $Q_{p2}$, the diode array $X_{p2}$ and the resistor $R_{p2}$ (or the pMOSFET $Q_{rp2}$). As trigger voltage $V_{t1}$ for a parasitic bipolar transistor of the protection pMOSFET $Q_{p2}$ can be also reduced in such configuration, negative overvoltage applied to the input terminal IN when the ground GND is open can be clamped.

As the structure of the electrostatic protection circuit of this embodiment is similar to that of the electrostatic protection circuits shown in FIG. 10 and FIG. 11 except that the additional deep n-type well surrounding the p-type well is required to bias the substrate of the nMOSFET, the description is omitted.

(Third Embodiment)

Figure 16:
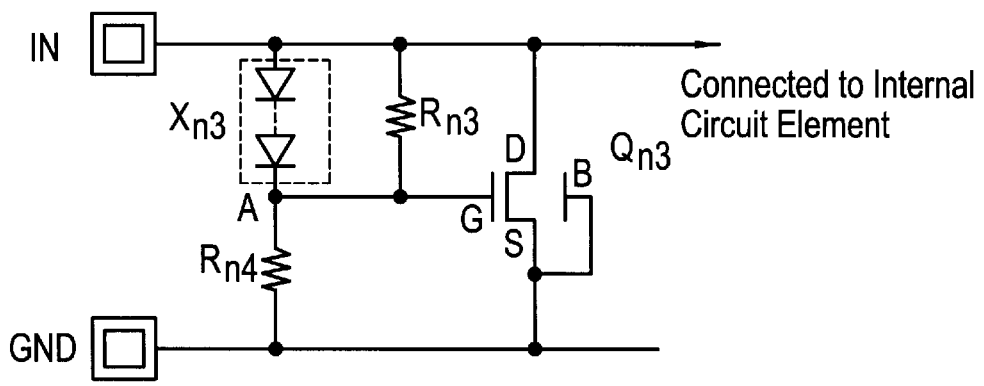
FIG. 16 is a circuit diagram showing a third embodiment of the electrostatic protection circuit according to the present invention.
Figure 17:
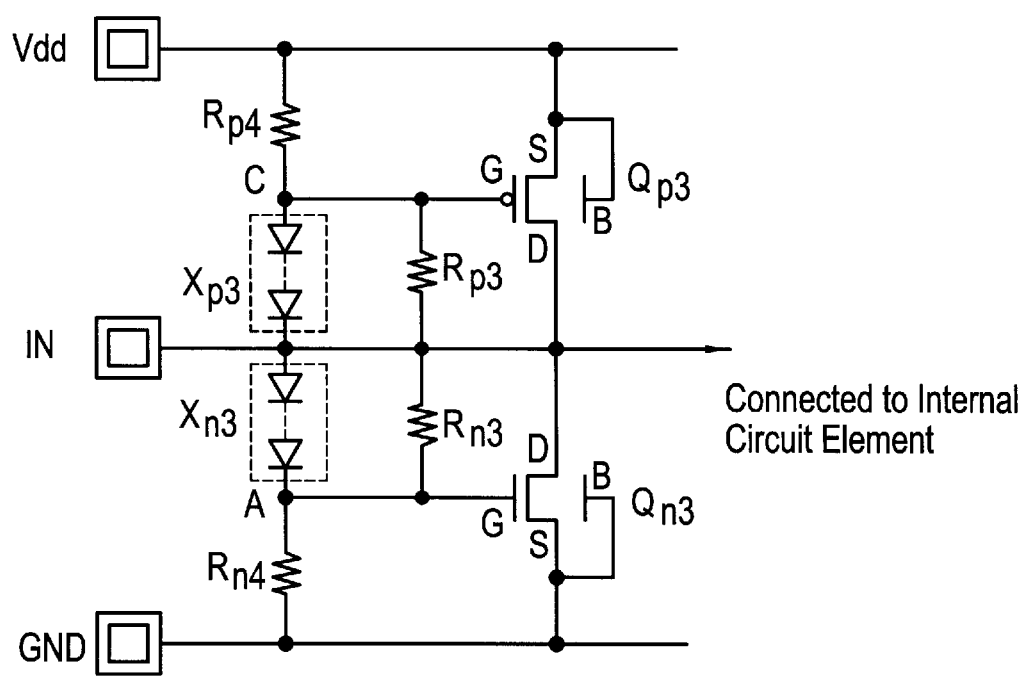
FIG. 17 is a circuit diagram showing another configuration of the third embodiment of the electrostatic protection circuit according to the present invention.

FIG. 16 is a circuit diagram showing a third embodiment of the electrostatic protection circuit according to the present invention. FIG. 17 is a circuit diagram showing another configuration of the third embodiment of the electrostatic protection circuit according to the present invention.

As shown in FIG. 16, an electrostatic protection circuit of this embodiment is provided with protection nMOSFET $Q_{n3}$, in which the drain (D) is connected to an input terminal IN and to an internal circuit element to be protected. The source (S) and the substrate (B) are grounded. A diode array $X_{n3}$, composed of at least one diode, is connected in series in a forward direction between the gate (G) of the protection nMOSFET $Q_{n3}$ and the input terminal IN. A resistor $R_{n3}$ is connected between the gate (G) of the protection nMOSFET $Q_{n3}$ and the input terminal IN. A resistor $R_{n4}$ is connected between the gate (G) of the protection nMOSFET $Q_{n3}$ and the ground GND.

The electrostatic protection circuit shown in FIG. 17 is provided with protection pMOSFET $Q_{p3}$, in which the drain (D) is connected to an input terminal IN and to an internal circuit element to be protected. The source (S) and the substrate (B) are connected to a power supply $V_{dd}$. A diode array $X_{p3}$, composed of at least one diode, is connected in series in a forward direction between the gate (G) of the protection pMOSFET $Q_{p3}$ and the input terminal IN. A resistor $R_{p3}$ is connected between the gate (G) of the protection pMOSFET $Q_{p3}$ and the input terminal IN. A resistor $R_{p4}$ is connected between the gate (G) of the protection pMOSFET $Q_{p3}$ and the power supply $V_{dd}$, in addition to the electrostatic protection circuit shown in FIG. 16.

Figure 18:
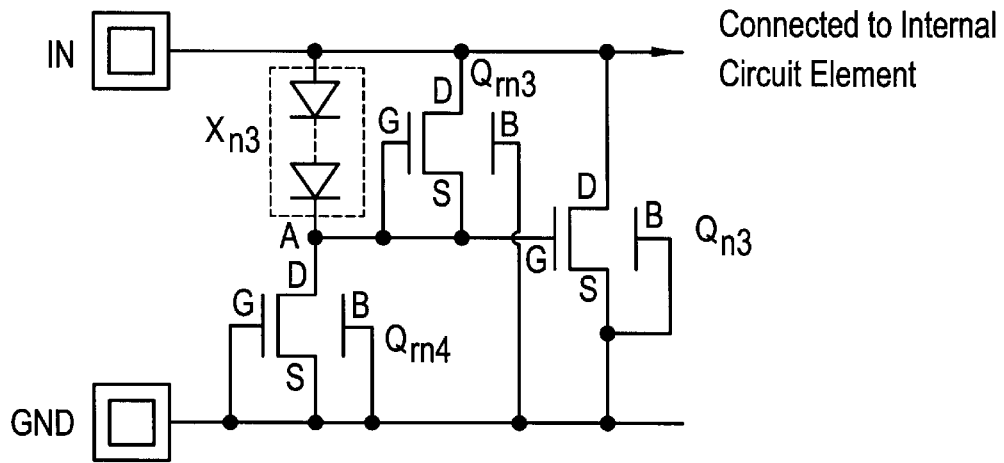
FIG. 18 is a circuit diagram showing another example of the electrostatic protection circuit shown in FIG. 16.
Figure 19:
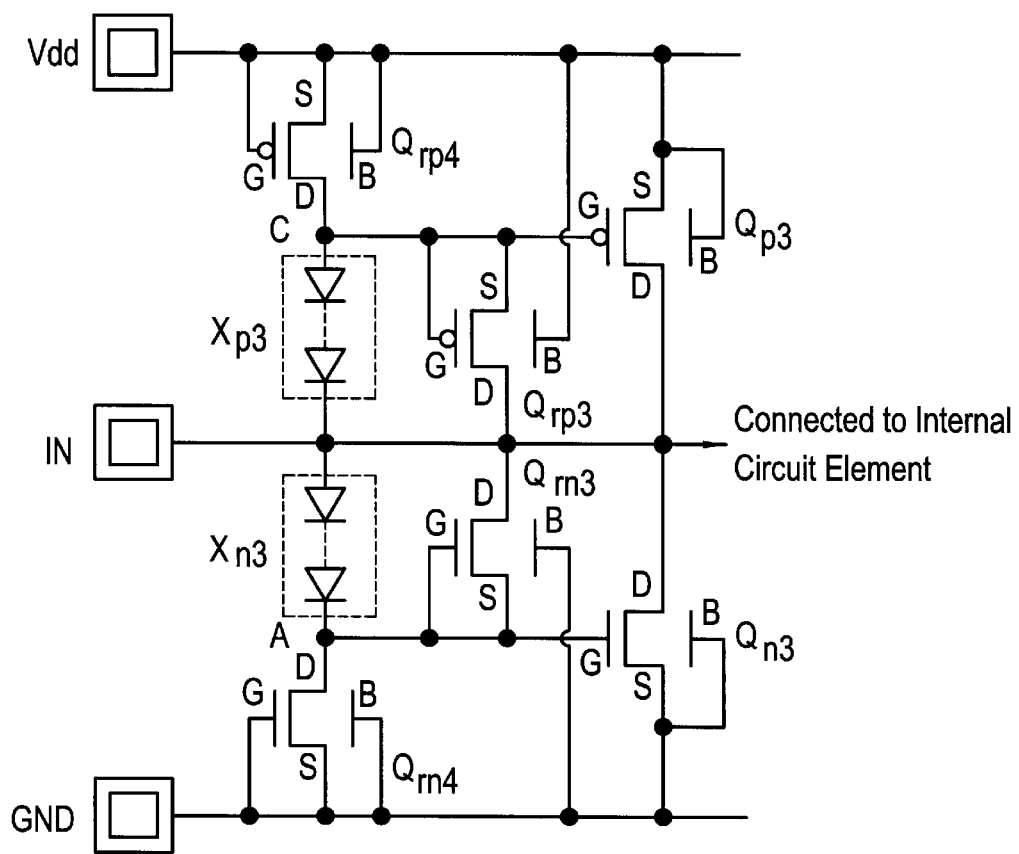
FIG. 19 is a circuit diagram showing another example of the electrostatic protection circuit shown in FIG. 17.

FIG. 18 is a circuit diagram showing another example of the electrostatic protection circuit shown in FIG. 16. FIG. 19 is a circuit diagram showing another example of the electrostatic protection circuit shown in FIG. 17.

As shown in FIG. 18, the resistor $R_{n3}$ of the electrostatic protection circuit shown in FIG. 16 can be replaced with nMOSFET $Q_{rn3}$ and the resistor $R_{n4}$ can be replaced with nMOSFET $Q_{rn4}$. The drain (D) of the nMOSFET $Q_{rn3}$ is connected to an input terminal IN. The gate (G) and the source (S) are connected to the gate (G) of protection nMOSFET $Q_{n3}$ and the substrate (B) is grounded. The drain (D) of the nMOSFET $Q_{m4}$ is connected to the gate (G) of protection nMOSFET $Q_{n3}$. The gate (G), the source (S) and the substrate (B) are grounded.

As shown in FIG. 19, the resistor $R_{p3}$ of the electrostatic protection circuit shown in FIG. 17 can be replaced with pMOSFET $Q_{rp3}$ and the resistor $R_{p4}$ can be replaced with pMOSFET $Q_{rp4}$. The drain (D) of the pMOSFET $Q_{rp3}$ is connected to an input terminal IN. The gate (G) and the source (S) are connected to the gate (G) of protection pMOSFET $Q_{p3}$ and the substrate (B) is grounded. The drain (D) of the pMOSFET $Q_{rp4}$ is connected to the gate (G) of the protection pMOSFET $Q_{p3}$. The gate (G), the source (S) and the substrate (B) are connected to a power supply $V_{dd}$. As in FIG. 18, a resistor $R_{n3}$ shown in FIG. 19 can be also replaced with nMOSFET $Q_{m3}$ and a resistor $R_{n4}$ shown in FIG. 19 can be also replaced with nMOSFET $Q_{m4}$.

Next, referring to the circuits shown in FIGS. 16 and 17, the operation of the electrostatic protection circuit of this embodiment will be described.

As shown in FIG. 18, when input voltage $V_{in}$ is applied to the input terminal IN, electric potential $V_a$ at a connection node A of a diode array $X_{n3}$ and the nMOSFET $Q_{m4}$ has a value acquired by dividing the input voltage $V_{in}$ by the resistance in a forward direction of the diode array $X_{n3}$ or the off-state resistance of the nMOSFET $Q_{n3}$ and the off-state resistance of the nMOSFET $Q_{m4}$.

The resistance in the forward direction of the diode array $X_{n3}$ is high (e.g., approximately $10^{14}$ Ω) when input voltage $V_{in}$ is lower than the product $(k \times V_f)$ of the number k of diodes in the diode array $X_{n3}$ and the forward voltage of the diode $V_f$. On the other hand, it is low (e.g., approximately 100 Ω) when input voltage $V_{in}$ is higher than the product $(k \times V_f)$. In the meantime, as a value of the off-state resistance of the nMOSFET $Q_{m3}$ and the nMOSFET $Q_{m4}$ only slightly depends upon the input voltage $V_{in}$ until a parasitic bipolar transistor conducts, the value can be regarded as substantially constant (e.g., approximately $10^{10}$ Ω).

Therefore, when input voltage $V_{in}$ is lower than the product $(k \times V_f)$ of the number k of diodes and the forward voltage of the diode $V_f$, electric potential $V_a$ at the connection node A of the diode array $X_{n3}$ and the nMOSFET $Q_{m4}$ has a value acquired by dividing the input voltage $V_{in}$ by the off-state resistance of the nMOSFET $Q_{m3}$ and the off-state resistance of the nMOSFET $Q_{m4}$.

As described above, the nMOSFET $Q_{m3}$ is a bypass of current when input voltage $V_{in}$ is lower than the product $(k \times V_f)$. Since the resistance of the diode array $X_{n3}$ is very high when input voltage $V_{in}$ is lower than the product $(k \times V_f)$, the diode array may be substantially open. Under such a situation, if no nMOSFET $Q_{m3}$ is provided, electric potential $V_a$ at the node A does not have a value acquired by simply dividing the input voltage $V_{in}$ by each off-state resistance of the diode array $X_{n3}$ and the nMOSFET $Q_{m4}$ and is influenced by the gate capacitance of the protection nMOSFET $Q_{n3}$ and others. To avoid such a problem, the off-state current of the nMOSFET $Q_{m3}$ is made to flow at the node A even if input voltage $V_{in}$ is lower than the product $(k \times V_f)$ so that the electric potential $V_a$ is determined by the division of resistance. As the channel width of the nMOSFET $Q_{m3}$ is approximately 1/10 as compared with that of the protection nMOSFET $Q_{n3}$, the off-state current is also approximately 1/10 as compared with that of the protection nMOSFET $Q_{n3}$. Therefore, the nMOSFET $Q_{m3}$ has no effect upon the power consumption of the whole chip.

As shown in FIG. 18, the gate (G), the source (S) and the substrate (B) of the nMOSFET $Q_{m4}$ are at the same potential and the substrate (B) of the nMOSFET $Q_{m3}$ is reversely biased to the source (S) (the electric potential of the substrate is lower than that of the source). Therefore, the threshold voltage $V_{th}$ of the nMOSFET $Q_{m3}$ is higher than that of the nMOSFET $Q_{m4}$. As a result, the off-state resistance of the nMOSFET $Q_{m3}$ is 10 to 100 times larger than that of the nMOSFET $Q_{m4}$. Therefore, electric potential $V_a$ at the node A is substantially equal to ground potential GND.

Figure 20:
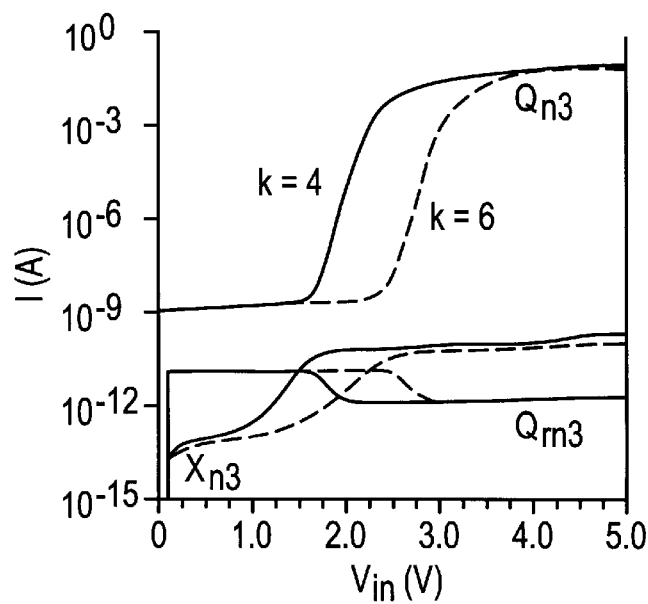
FIG. 20 is a graph showing relationship between input voltage $V_{in}$ and current that flows in the main part of the electrostatic protection circuit shown in FIG. 18.

In the meantime, when input voltage $V_{in}$ is higher than the product $(k \times V_f)$, electric potential $V_a$ at the node A has a value acquired by dividing the input voltage $V_{in}$ by the resistance in a forward direction of the diode array $X_{n3}$ and the off-state resistance of the nMOSFET $Q_{m4}$ and increases together with input voltage $V_{in}$ as shown in FIG. 8. FIG. 20 shows current that flows in the diode array $X_{n3}$, the protection nMOSFET $Q_{n3}$ and the nMOSFET $Q_{m3}$ at this time. FIG. 20 shows the cases that the number k of diodes in the diode array $X_{n1}$ is 4 (shown by a full line) and is 6 (shown by a dotted line).

In this embodiment, when input voltage $V_{in}$ exceeds source voltage $V_{dd}$, the number k of diodes in the diode array $X_{n3}$ and an off-state resistance value (which is controlled by the threshold voltage) of the nMOSFET $Q_{m4}$ are set so that voltage exceeding the threshold voltage $V_{th}$ is applied to the gate of the protection nMOSFET $Q_{n3}$ and the protection nMOSFET $Q_{n3}$ is turned on.

By setting as described above, in the electrostatic protection circuit shown in FIG. 18, when input voltage $V_{in}$ is in a normal region ($0 \leq V_{in} \leq V_{dd}$), the protection nMOSFET $Q_{n3}$ is kept off and when input voltage $V_{in}$ is in an abnormal region ($V_{in} > V_{dd}$), the protection nMOSFET $Q_{n3}$ is turned on. When the protection nMOSFET $Q_{n3}$ is turned on, channel current flows, substrate current also increases because impact ionization is accelerated and trigger voltage $V_{t1}$ for snapback is reduced down to $V_{t1}$ as shown in FIG. 9.

Therefore, as in the first embodiment, as trigger voltage $V_{t1}$ can be set to desired voltage (low voltage) by adjusting the number k of diodes in the diode array $X_{n3}$ or an off-state resistance value (which is controlled by the threshold voltage) of the nMOSFET $Q_{m4}$, the breakdown of an internal circuit element with low breakdown voltage can be prevented.

In the meantime, the electrostatic protection circuit shown in FIG. 19 is operated as the electrostatic protection circuit shown in FIG. 18 in the case that a power supply $V_{dd}$ is open. In the case that the ground GND is open, when positive voltage exceeding supply voltage $V_{dd}$ is applied to the input terminal IN, current flows from the input terminal IN to the power supply $V_{dd}$ via a PN junction between the drain (D) and the substrate (B) of the protection pMOSFET $Q_{p3}$ and positive overvoltage applied to the input terminal IN is clamped.

Further, as in the electrostatic protection circuit shown in FIG. 18, if the number k of diodes in the diode array $X_{p3}$ and an off-state resistance value (which is controlled by the threshold voltage) of the pMOSFET $Q_{m4}$ are set so that the protection pMOSFET $Q_{p3}$ is turned on when input voltage $V_{in}$ is less than ground potential GND, the protection pMOSFET $Q_{p3}$ is kept off when input voltage $V_{in}$ is in a normal region ($0 \leq V_{in} \leq V_{dd}$) and the protection pMOSFET $Q_{p3}$ is turned on when input voltage $V_{in}$ is in an abnormal region ($V_{in} < 0$). Therefore, as in the protection nMOSFET $Q_{n3}$ shown in FIG. 18, channel current flows, substrate current also increases because impact ionization is accelerated and trigger voltage $V_{t1}$ for snapback is reduced.

Therefore, as in the electrostatic protection circuit shown in FIG. 19, not only trigger voltage $V_{t1}$ for a parasitic bipolar transistor of the protection nMOSFET $Q_{n3}$ but trigger voltage $V_{t1}$ for a parasitic bipolar transistor of the protection pMOSFET $Q_{p3}$ can be reduced as in the first embodiment, respective positive and negative overvoltage applied to the input terminal IN can be also clamped in the case that either of the power supply $V_{dd}$ or the ground GND is open.

To securely keep the protection nMOSFET $Q_{n3}$ or the protection pMOSFET $Q_{p3}$ turned off when input voltage $V_{in}$ is in a normal region ($0 \leq V_{in} \leq V_{dd}$), an off-state resistance value has only to be different between the nMOSFET $Q_{m3}$ and the nMOSFET $Q_{m4}$ or between the pMOSFET $Q_{rp3}$ and the pMOSFET $Q_{rp4}$.

For a method of making difference in an off-state resistance value, there is a method of setting so that the gate length of the nMOSFET $Q_{m3}$ is longer than that of the nMOSFET $Q_{m4}$. Threshold voltage $V_{th}$ is higher by approximately 0.1 V and an off-state resistance value is increased by approximately 10 times if the gate length is increased by 0.1 $\mu$m in a short channel region.

Figure 21:
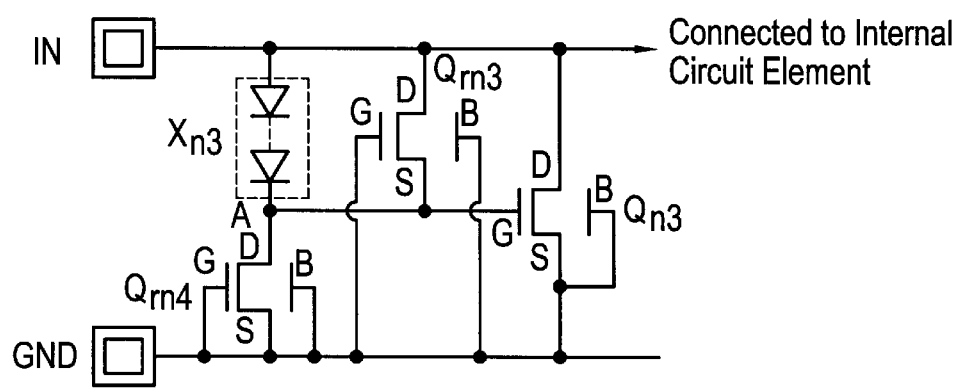
FIG. 21 is a circuit diagram showing another example of the electrostatic protection circuit shown in FIG. 16.
Figure 22:
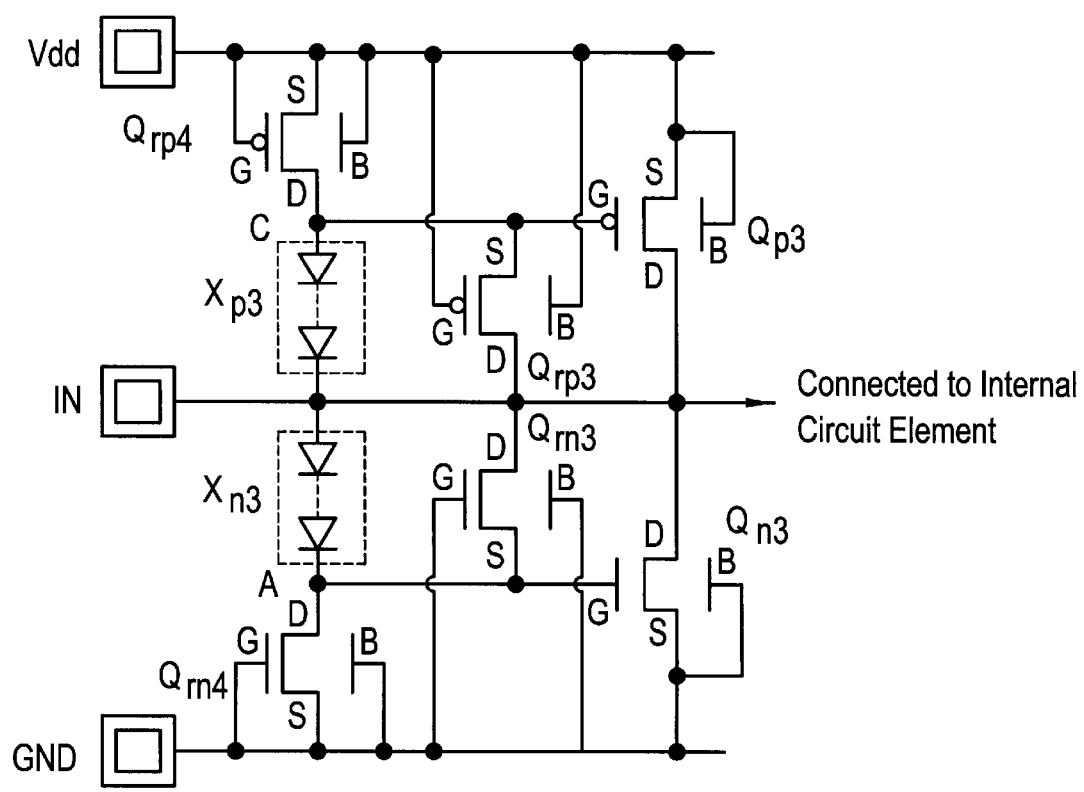
FIG. 22 is a circuit diagram showing another example of the electrostatic protection circuit shown in FIG. 17.

For another method for making difference in an off-state resistance value, there are also a configuration with the gate (G) of nMOSFET $Q_{m3}$ is grounded as shown in FIG. 21 and the configuration with the gate (G) of pMOSFET $Q_{rp3}$ is connected to a power supply $V_{dd}$ as shown in FIG. 22. In this case, as the nMOSFET $Q_{m3}$ and the pMOSFET $Q_{rp3}$ are operated so that the off-state resistance value is increased, off-state resistance value of the nMOSFET $Q_{m3}$ and the pMOSFET $Q_{rp3}$ can be larger than off-state resistance value of nMOSFET $Q_{m4}$ and pMOSFET $Q_{rp4}$, respectively.

Although, the electrostatic protection circuits shown in FIGS. 17, 19 and 22 are provided with the protection nMOSFET $Q_{n3}$ and the protection pMOSFET $Q_{p3}$, only the protection pMOSFET $Q_{p3}$, the diode array $X_{p3}$, the resistor $R_{p3}$ (or the pMOSFET $Q_{rp3}$) and the resistor $R_{p4}$ (or the pMOSFET $Q_{rp4}$) may be also provided. As trigger voltage $V_{t1}$ for a parasitic bipolar transistor of the protection pMOSFET $Q_{p3}$ can be also reduced in such case, negative overvoltage applied to the input terminal IN can be clamped when the ground GND is open.

Next, referring to the drawings, the manufacturing method of the electrostatic protection circuit of this embodiment will be described.

Figure 23:
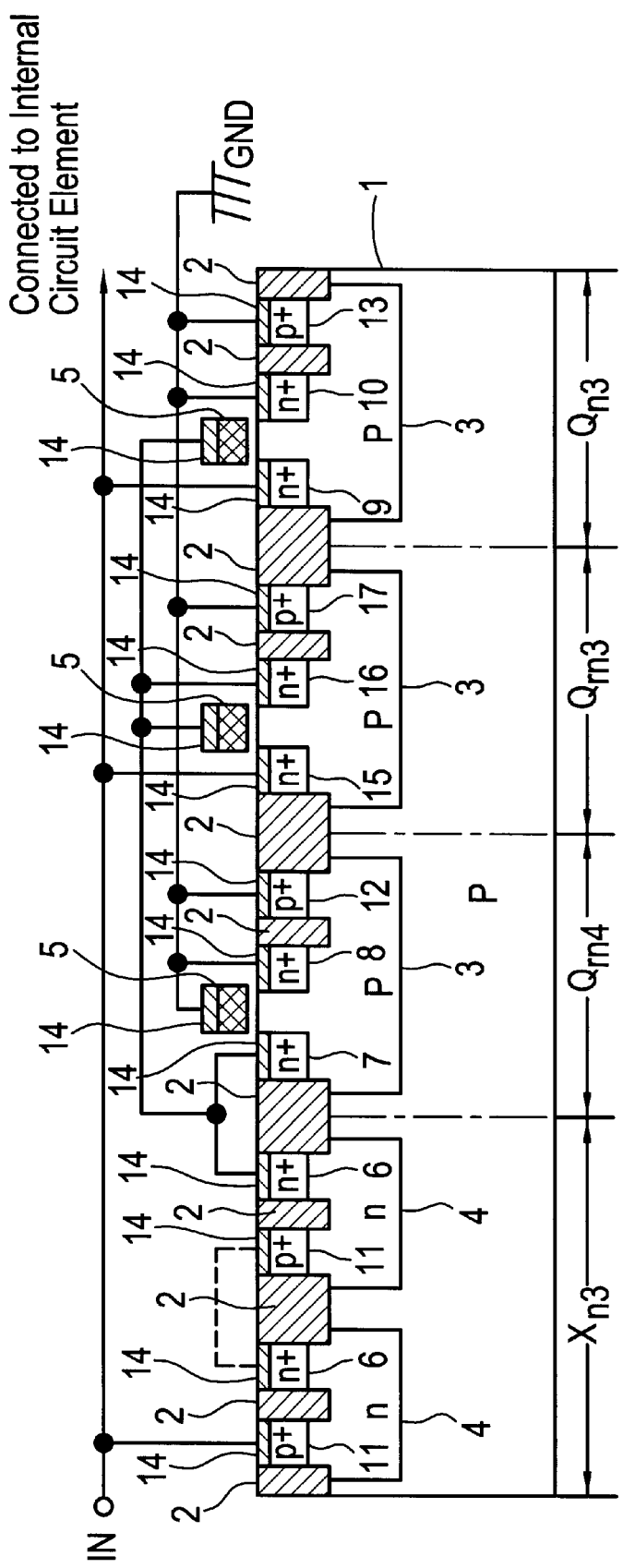
FIG. 23 is a cross sectional view of the electrostatic protection circuit, shown in FIG. 18, formed on a silicon substrate.
Figure 24:
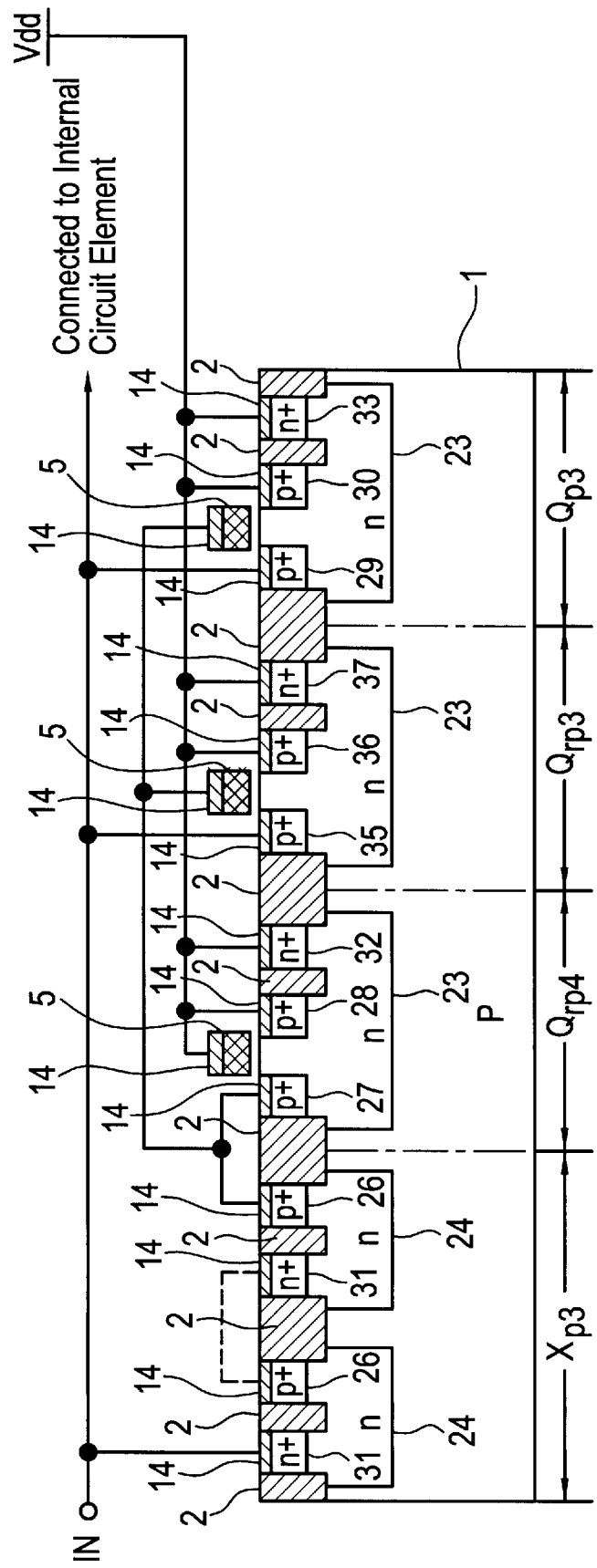
FIG. 24 is a cross sectional view of the electrostatic protection circuit, shown in FIG. 16, formed on a silicon substrate.

FIG. 23 is a cross sectional view showing the electrostatic protection circuit, shown in FIG. 18, formed on a silicon substrate. FIG. 24 is a cross sectional view showing the electrostatic protection circuit, shown in FIG. 19, formed on a silicon substrate. In FIG. 23, two diodes are shown as a diode array $X_{n3}$. In FIG. 24, only the protection pMOSFET $Q_{p3}$, the diode array $X_{p3}$ (comprising two diodes), the pMOSFET $Q_{rp3}$ and the pMOSFET $Q_{rp4}$ in the electrostatic protection circuit shown in FIG. 19 are shown. As the structure of the protection nMOSFET $Q_{n3}$, the diode array $X_{n3}$, the nMOSFET $Q_{m3}$ and the nMOSFET $Q_{m4}$ is similar to that in FIG. 23, the description is omitted.

As shown in FIG. 23, the electrostatic protection circuit shown in FIG. 18 is first formed by forming a field oxide film 2 approximately 400 nm thick in a p-type substrate 1 and implanting boron into an nMOSFET formation region by $2\times10^{13}$ cm$^{-2}$ at 300 keV, by $4\times10^{12}$ cm$^{-2}$ at 200 keV and by $5\times10^{12}$ cm$^{-2}$ at 30 keV continuously using photoresist as a mask so as to form a p-type well 3.

Next, an n-type well 4 is formed by implanting phosphorus into each diode formation region of a diode array $X_{n3}$ by $2\times10^{13}$ cm$^{-2}$ at 700 keV and by $4\times10^{12}$ cm$^{-2}$ at 500 keV and further, implanting arsenic by $5\times10^{12}$ cm$^{-2}$ at 100 keV by using photoresist as a mask.

Next, a gate oxide film approximately 3.5 nm thick is formed on the p-type substrate 1 and a gate electrode 5 made of polycrystalline silicon and having the thickness of 150 nm and the width of 0.18 $\mu$m is formed on the gate oxide film.

Next, after an n$^-$ diffusion layer (not shown) to be a source and a drain is formed by implanting arsenic into an nMOSFET formation region by $3\times10^{14}$ cm$^{-2}$ at 10 keV by using the gate electrode 5 as a mask, a gate side wall (not shown) made of an oxide film approximately 100 nm wide is formed on the side wall of the gate electrode 5.

Next, n$^+$ diffusion layers 6–10, 15 and 16 are formed by implanting arsenic into an nMOSFET formation region and a diode formation region by $3\times10^{15}$ cm$^{-2}$ at 50 keV by using photoresist, the gate electrode 5 and the gate side wall as a mask. The n$^+$ diffusion layer 6 is the cathode of each diode composing the diode array $X_{n3}$, the n$^+$ diffusion layer 7 is the drain (D) of the nMOSFET $Q_{m4}$ the n$^+$ diffusion layer 8 is the source (S) of the nMOSFET $Q_{m4}$, the n$^+$ diffusion layer 9 is the drain (D) of the protection nMOSFET $Q_{n3}$, the n$^+$ diffusion layer 10 is the source (S) of the protection nMOSFET $Q_{n3}$, the n$^+$ diffusion layer 15 is the drain (D) of the nMOSFET $Q_{m3}$ and the n$^+$ diffusion layer 16 is the source (S) of the nMOSFET $Q_{m3}$.

Next, p$^+$ diffusion layers 11–13 and 17 are formed by implanting boron difluoride (BF$_2$) into a diode formation region and a nMOSFET formation region by $3\times10^{15}$ cm$_{-2}$ at 30 keV by using photoresist as a mask. The p$^+$ diffusion layer 11 is the anode of each diode composing the diode array $X_{n3}$, the p$^+$ diffusion layer 12 is a p-type well contact for the nMOSFET $Q_{m4}$, the p$^+$ diffusion layer 13 is a p-type well contact for the protection nMOSFET $Q_{n3}$ and the p$^+$ diffusion layer 17 is a p-type well contact for wiring in the substrate (B) of the nMOSFET $Q_{m3}$.

Finally, after a cobalt silicide layer 14 having the thickness of 30 nm is formed on each surface of the gate electrode 5, the n$^+$ diffusion layers 6–10, 15 and 16 and the p$^+$ diffusion layers 11–13 and 17 and a passivation film (not shown) is formed. Wiring is made on each cobalt silicide layer 14.

As shown in FIG. 24, the electrostatic protection circuit shown in FIG. 19 is first formed by forming a field oxide film 2 approximately 400 nm thick in the p-type substrate 1, and implanting phosphorus into each diode formation region of the diode array $X_{p3}$ and a pMOSFET formation region by $2\times10^{13}$ cm$^{-2}$ at 700 keV and by $4\times10^{12}$ cm$^{-2}$ at 500 keV and further, implanting arsenic by $5\times10^{12}$ cm$^{-2}$ at 100 keV by using photoresist as a mask so as to form n-type wells 23–24 (formed at the same time as the n-type well 4 shown in FIG. 23).

Next, a gate oxide film approximately 3.5 nm thick is formed on the p-type substrate 1 and a gate electrode 5 made of polycrystalline silicon and having the thickness of 150 nm and the width of 0.18 $\mu$m is formed on the gate oxide film.

Next, after a p$^-$ diffusion layer (not shown) to be a portion of a source and a drain is formed by implanting boron difluoride (BF$_2$) into a pMOSFET formation region by $3\times10^{14}$ cm$^{-2}$ at 10 keV by using the gate electrode 5 as a mask, a gate side wall (not shown) made of an oxide film approximately 100 nm wide is formed on the side of the gate electrode 5.

Next, n$^+$ diffusion layers 31–33 and 37 are formed by implanting arsenic into a pMOSFET formation region and a diode formation region by $3\times10^{15}$ cm$^{-2}$ at 50 keV by using photoresist, the gate electrode 5 and the gate side wall as a mask (formed at the same time as the n$^+$ diffusion layers 6 to 10 shown in FIG. 23). The n$^+$ diffusion layer 31 is the cathode of each diode composing the diode array $X_{p3}$, the n$^+$ diffusion layer 32 is an n-type well contact for the pMOSFET $Q_{rp4}$, the n$^+$ diffusion layer 33 is an n-type well contact for the protection pMOSFET $Q_{p3}$ and the n+ diffusion layer 37 is an n-type well contact for the pMOSFET $Q_{rp3}$.

Next, p+ diffusion layers 26–30, 35 and 36 (formed at the same time as the p+ diffusion layers 11 to 13 shown in FIG. 23) are formed by implanting boron difluoride ($BF_2$) into a diode formation region and a pMOSFET formation region by $3 \times 10^{15}$ cm$^{-2}$ at 30 keV by using photoresist as a mask. The p+ diffusion layer 26 is the anode of each diode composing the diode array $X_{p3}$, the p+ diffusion layer 27 is the drain (D) of the pMOSFET $Q_{rp4}$, the p+ diffusion layer 28 is the source (S) of the pMOSFET $Q_{rp4}$, the p+ diffusion layer 29 is the drain (D) of the protection pMOSFET $Q_{p3}$, the p+ diffusion layer 30 is the source (S) of the protection pMOSFET $Q_{p3}$, the p+ diffusion layer 35 is the drain (D) of the pMOSFET $Q_{p3}$ and the p+ diffusion layer 36 is the source (S) of the pMOSFET $Q_{rp3}$.

Finally, after a cobalt silicide layer 14 having the thickness of 30 nm is formed on each surface of the gate electrode 5, the p+ diffusion layers 26–30, 35 and 36 and the n+ diffusion layers 31–33 and 37 and a passivation film (not shown) is formed. Wiring is made on each cobalt silicide layer 14.

As each diode composing the diode arrays $X_{n3}$ and $X_{p3}$ can be formed in a common process with the protection nMOSFET $Q_{n3}$ and nMOSFETs $Q_{rn3}$ and $Q_{rn4}$ or the protection pMOSFET $Q_{p3}$ and pMOSFETs $Q_{rp3}$ and $Q_{rp4}$ as described above, the electrostatic protection circuit according to the invention can be formed without increasing process steps, as compared with the conventional type structure.

(Fourth Embodiment)

Figure 25:
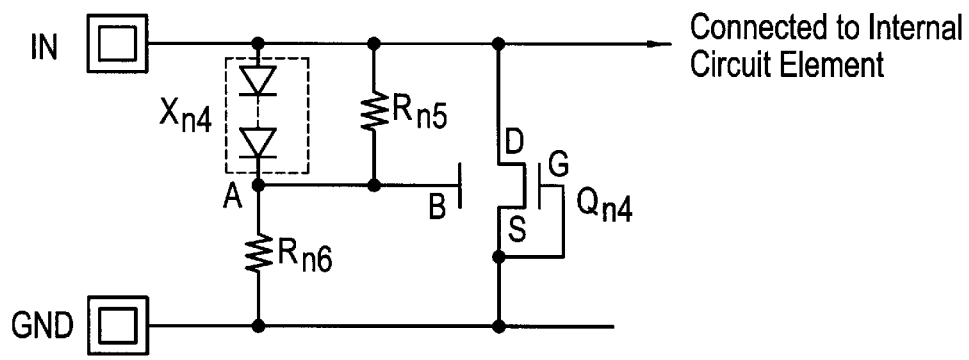
FIG. 25 is a circuit diagram showing a fourth embodiment of the electrostatic protection circuit according to the present invention.
Figure 26:
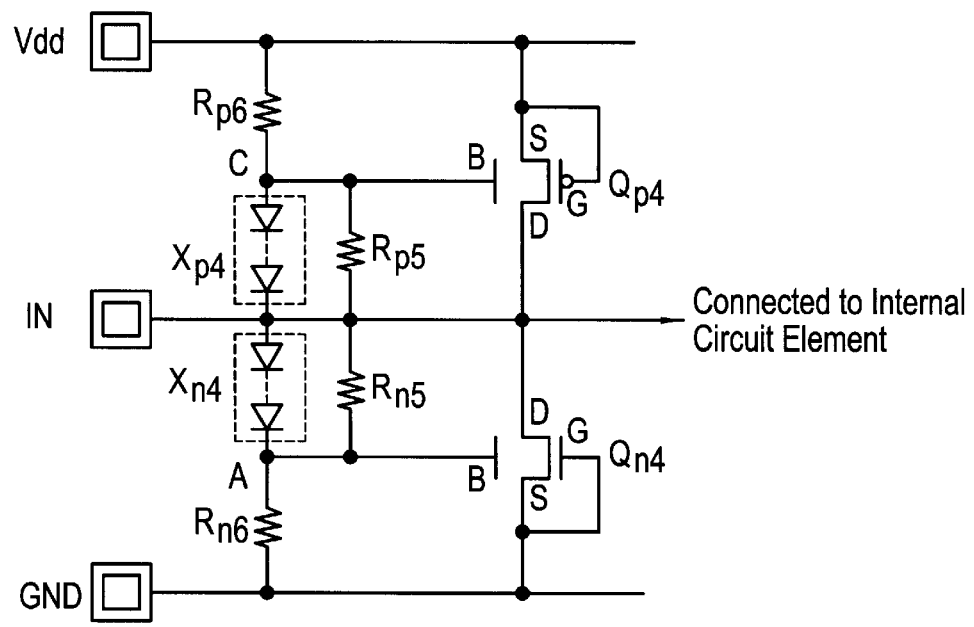
FIG. 26 is a circuit diagram showing another configuration of the fourth embodiment of the electrostatic protection circuit according to the present invention.

FIG. 25 is a circuit diagram showing a fourth embodiment of the electrostatic protection circuit according to the present invention and FIG. 26 is a circuit diagram showing another configuration of the fourth embodiment of the electrostatic protection circuit according to the present invention.

As shown in FIG. 25, an electrostatic protection circuit this embodiment is provided with protection nMOSFET $Q_{n4}$ in which the drain (D) is connected to an input terminal IN, and the source (S) and the gate (G) are grounded. A diode array $X_{n4}$, composed of at least one diode, is connected in series in a forward direction between the substrate (B) of the protection nMOSFET $Q_{n4}$ and the input terminal IN and to an internal circuit element to be protected. A resistor $R_{n5}$ is connected between the substrate (B) of the protection nMOSFET $Q_{n4}$ and the input terminal IN. A resistor $R_{n6}$ is connected between the substrate (B) of the protection nMOSFET $Q_{n4}$ and the ground GND.

The electrostatic protection circuit shown in FIG. 26 is provided with protection pMOSFET $Q_{p4}$ in which the drain (D) is connected to an input terminal IN and to an internal circuit element to be protected. The source (S) and the gate (G) are connected to a power supply $V_{dd}$. A diode array $X_{p4}$, composed of at least one diode, is connected in series in a forward direction between the substrate (B) of the protection pMOSFET $Q_{p4}$ and the input terminal IN. A resistor $R_{p5}$ is connected between the substrate (B) of the protection pMOSFET $Q_{p4}$ and the input terminal IN. A resistor $R_{p6}$ is connected between the substrate (B) of the protection pMOSFET $Q_{p4}$ and the power supply $V_{dd}$ in addition to the configuration of the electrostatic protection circuit shown in FIG. 25.

Figure 27:
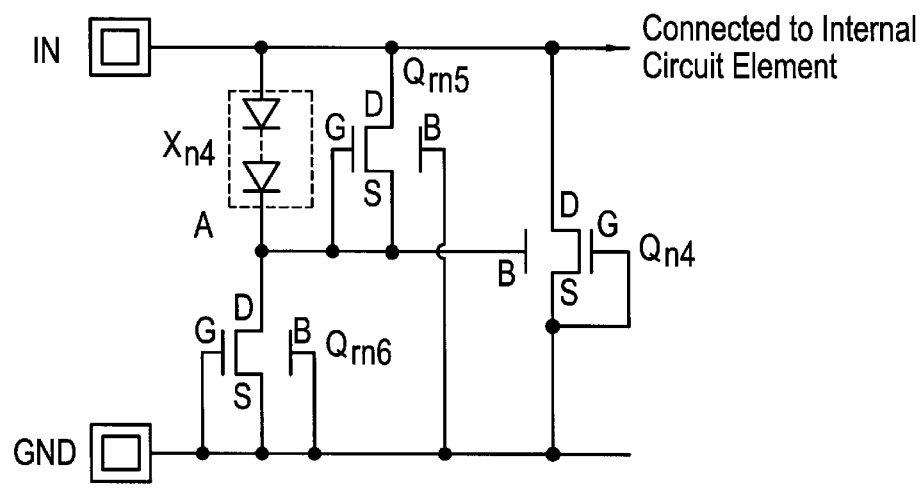
FIG. 27 is a circuit diagram showing another example of the electrostatic protection circuit shown in FIG. 25.
Figure 28:
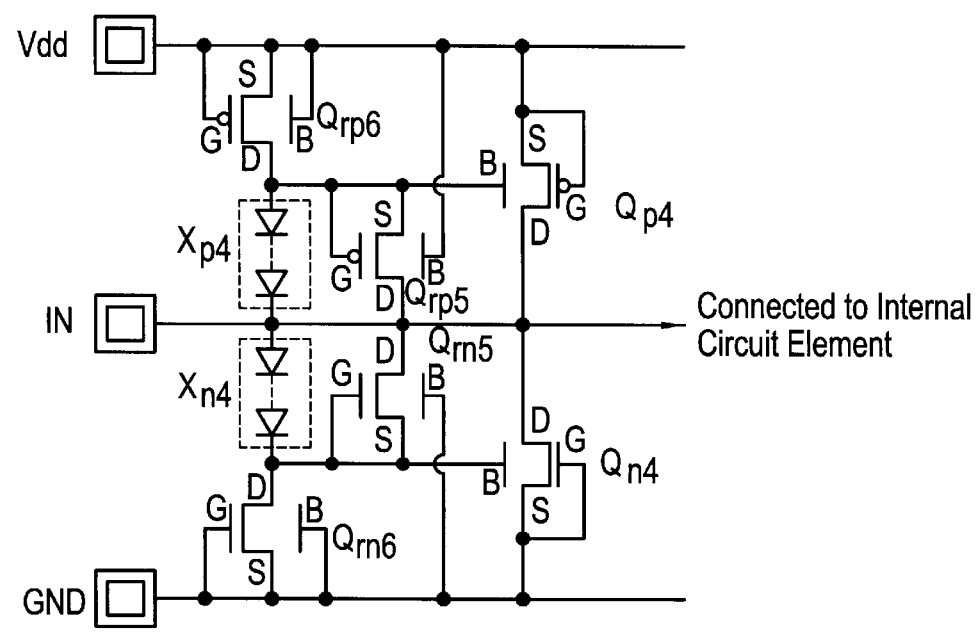
FIG. 28 is a circuit diagram showing another example of the electrostatic protection circuit shown in FIG. 26.

FIG. 27 is a circuit diagram showing another example of the electrostatic protection circuit shown in FIG. 25. FIG. 28 is a circuit diagram showing another example of the electrostatic protection circuit shown in FIG. 26.

As shown in FIG. 27, the resistor $R_{n5}$ of the electrostatic protection circuit shown in FIG. 25 can be replaced with nMOSFET $Q_{rn5}$ and the resistor $R_{n6}$ can be replaced with nMOSFET $Q_{rn6}$. The drain (D) of the nMOSFET $Q_{rn5}$ is connected to an input terminal IN. The gate (G) and the source (S) are connected to the substrate (B) of protection nMOSFET $Q_{n4}$ and the substrate (B) is grounded. The drain (D) of the nMOSFET $Q_{rn6}$ is connected to the substrate (B) of protection nMOSFET $Q_{n4}$. The gate (G), the source (S) and the substrate (B) are grounded.

As shown in FIG. 28, the resistor $R_{p5}$ of the electrostatic protection circuit shown in FIG. 26 can be replaced with pMOSFET $Q_{rp5}$ and the resistor $R_{p6}$ can be replaced with pMOSFET $Q_{rp6}$. The drain (D) of the pMOSFET $Q_{rp5}$ is connected to an input terminal IN. The gate (G) and the source (S) are connected to the substrate (B) of protection pMOSFET $Q_{p4}$. The substrate (B) is connected to a power supply $V_{dd}$. Also, the drain (D) of the pMOSFET $Q_{rp6}$ is connected to the substrate (B) of protection pMOSFET $Q_{p4}$. The gate (G), the source (S) and the substrate (B) are connected to the power supply $V_{dd}$. As in FIG. 27, the resistor $R_{n5}$ shown in FIG. 26 can be replaced with nMOSFET $Q_{rn5}$ and the resistor $R_{n6}$ shown in FIG. 26 can be replaced with nMOSFET $Q_{rn6}$.

Next, referring to the circuits shown in FIG. 27 and FIG. 28, the operation of the electrostatic protection circuit of this embodiment having such configuration will be described.

As shown in FIG. 27, as the diode array $X_{n4}$ and the nMOSFET $Q_{rn6}$ of the electrostatic protection circuit of this embodiment have the similar configuration to the diode array $X_{n3}$ and the nMOSFET $Q_{rn4}$ in the third embodiment, electric potential $V_a$ at a node A is substantially equal to ground potential GND when input voltage $V_{in}$ is lower than the product ($k \times V_f$) of the number k of diodes in the diode array $X_{n4}$ and forward voltage $V_f$ and increases with input voltage $V_{in}$ when the input voltage $V_{in}$ is higher than the product ($k \times V_f$).

In this embodiment, the number k of diodes in the diode array $X_{n4}$ and an off-state resistance value (which is controlled by the threshold voltage) of the nMOSFET $Q_{rn6}$ are set so that forward current flows across a PN junction of the substrate (B) and the source (S) of the protection nMOSFET $Q_{n4}$ when input voltage $V_{in}$ exceeds supply voltage $V_{dd}$.

In the electrostatic protection circuit shown in FIG. 27, by setting as described above, when input voltage $V_{in}$ is in a normal region ($0 \leq V_{in} \leq V_{dd}$), the protection nMOSFET $Q_{n4}$ is kept off and when input voltage $V_{in}$ is abnormal region ($V_{in} > V_{dd}$), forward current flows across the PN junction of the substrate (B) and the source (S) of the protection nMOSFET $Q_{n4}$. Therefore, the forward current reduces trigger voltage $V_{t1}$ for snapback.

In the meantime, the electrostatic protection circuit shown in FIG. 28 is operated as the electrostatic protection circuit shown in FIG. 27 in the case that the power supply $V_{dd}$ is open. In the case that the ground GND is open, the number k of diodes in the diode array $X_{p4}$ and an off-state resistance value (which is controlled by the threshold voltage) of the pMOSFET $Q_{rp6}$ are set as in the electrostatic protection circuit shown in FIG. 27 so that forward current flows across the PN junction between the substrate (B) and the source (S) of the protection pMOSFET $Q_{p4}$ when input voltage $V_{in}$ is less than ground potential GND.

By setting as described above, when input voltage $V_{in}$ is in a normal region ($0 \leq V_{in} \leq V_{dd}$), the protection pMOSFET $Q_{p4}$ is kept off and when input voltage $V_{in}$ is in an abnormal region ($V_{in} < 0$), forward current flows across the PN junction of the substrate (B) and the source (S) of the protection pMOSFET $Q_{p4}$. Therefore, the forward current reduces trigger voltage $V_{t1}$ for snapback.

As a result, the similar effect to that in the electrostatic protection circuit of the third embodiment can be also acquired in the electrostatic protection circuit of this embodiment.

As in the third embodiment, to securely keep the protection nMOSFET $Q_{n4}$ or the protection pMOSFET $Q_{p4}$ turned off when input voltage $V_{in}$ is in a normal region ($0 \leq V_{in} \leq V_{dd}$), an off-state resistance value has only to be different between the nMOSFET $Q_{rn5}$ and that of the nMOSFET $Q_{rn6}$ or between the pMOSFET $Q_{rp5}$ and the pMOSFET $Q_{rp6}$.

For a method of making difference in an off-state resistance value, there is a method of setting so that the gate length of the nMOSFET $Q_{rn}$ is longer than that of the nMOSFET $Q_{rn6}$.

Figure 29:
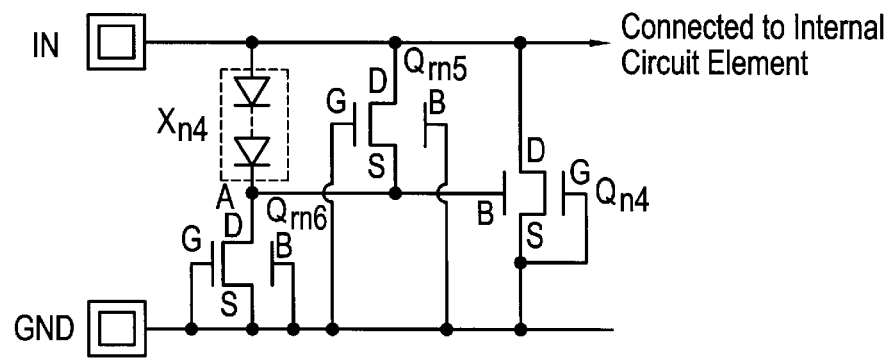
FIG. 29 is a circuit diagram showing further another example of the electrostatic protection circuit shown in FIG. 25.

For another method for making difference in an off-state resistance value, there are configuration that the gate (G) of the nMOSFET $Q_{rn5}$ is grounded as shown in FIG. 28 and configuration that the gate (G) of the pMOSFET $Q_{rp5}$ is connected to a power supply $V_{dd}$ as shown in FIG. 29. In this case, as the nMOSFET $Q_{rn5}$ and the pMOSFET $Q_{rp5}$ are operated so that the substrate is reverse-biased, each off-state resistance value of the nMOSFET $Q_{rn5}$ and the pMOSFET $Q_{rp5}$ can be larger than each off-state resistance value of nMOSFET $Q_{rn6}$ and pMOSFET $Q_{rp6}$.

Figure 30:
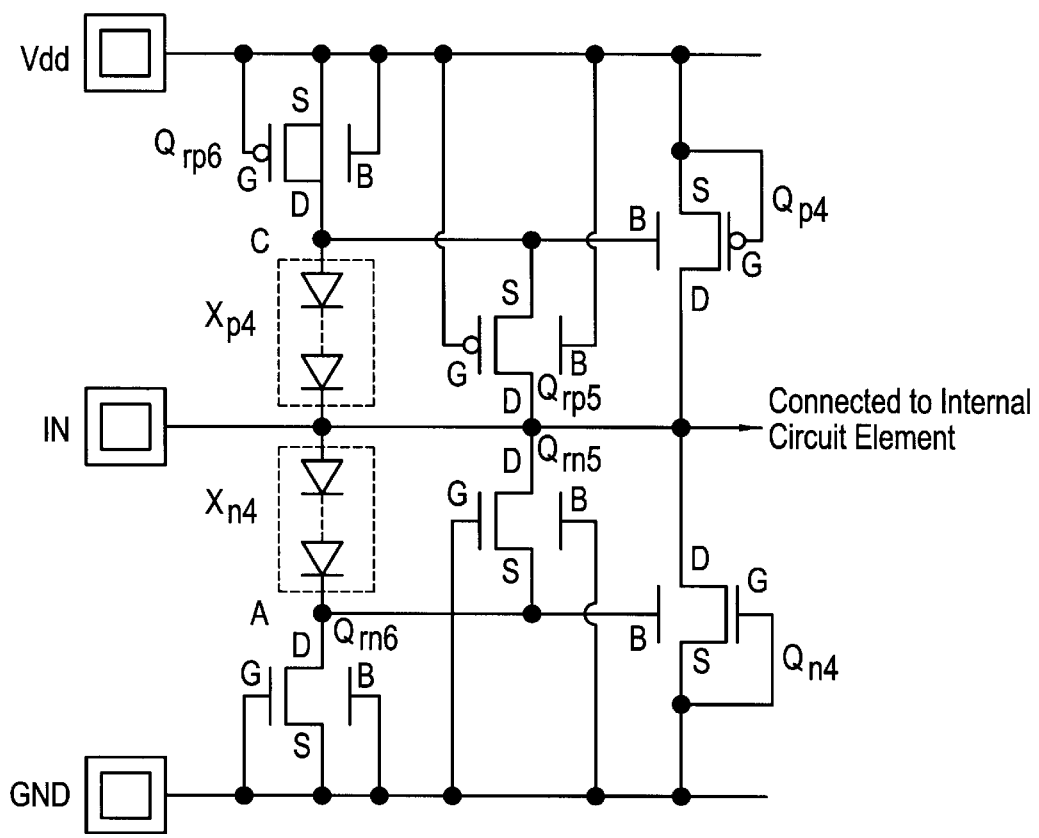
FIG. 30 is a circuit diagram showing further another example of the electrostatic protection circuit shown in FIG. 26.

Although the electrostatic protection circuits shown in FIG. 26, FIG. 28 and FIG. 30 are provided with the protection nMOSFET $Q_{n4}$ and the protection pMOSFET $Q_{p4}$, only the protection pMOSFET $Q_{p4}$, the diode array $X_{p4}$, the resistor $R_{p5}$ (or the pMOSFET $Q_{rp5}$) and the resistor $R_{p6}$ (or the pMOSFET $Q_{rp6}$) may be provided. As trigger voltage $V_{t1}$ for a parasitic bipolar transistor of the protection pMOSFET $Q_{p4}$ can be also reduced in such configuration, negative overvoltage applied to the input terminal IN can be clamped when the ground GND is open.

As the structure of the electrostatic protection circuit of this embodiment is similar to that of the electrostatic protection circuits of the third embodiment shown in FIG. 23 and FIG. 24 except that the deep n-type well surrounding the p-type well is required to bias the substrate of the nMOSFET, the description is omitted.

Although in the first to the fourth embodiments, the electrostatic protection circuit only on the side of the input terminal IN of the internal circuit element to be protected is shown, an electrostatic protection circuit on the side of an output terminal of the internal circuit element may be also provided similarly. In that case, as positive or negative overvoltage applied to the output terminal can be also clamped, the breakdown of the internal circuit element can be prevented.

As the electrostatic protection circuit according to the present invention is configured as described above, the following effect is obtained.

When voltage applied to the input-output terminal exceeds supply voltage or is less than ground potential or less, the substrate current of the protection nMOSFET or the protection pMOSFET increases and trigger voltage for snapback can be reduced. Therefore, when the power supply $V_{dd}$ is open, positive overvoltage applied to the input/output terminal can be clamped by the protection nMOSFET so that the positive overvoltage becomes desired voltage and when the ground GND is open, negative overvoltage applied to the input/output terminal can be clamped by the protection pMOSFET so that the negative overvoltage becomes desired voltage.

The present invention is not limited to the above embodiments, and it is contemplated that numerous modifications may be made without departing from the spirit and scope of the invention. The electrostatic protection circuit, as described above with reference to the drawings, is a merely an exemplary embodiment of the invention, and the scope of the invention is not limited to these particular embodiments. Accordingly, other structural configurations may be used, without departing from the spirit and scope of the invention as defined in the following claims.

What is claimed is:

1. An electrostatic protection circuit, comprising:
   a first protection MOSFET comprising a drain connected to an input/output terminal, and a source and a substrate connected to a predetermined voltage source;
   a first diode array comprising at least one diode and connected in series in a forward direction between a gate of the first protection MOSFET and the input/output terminal; and
   a first resistor connected between the gate of the first protection MOSFET and the predetermined voltage source.

2. The electrostatic protection circuit according to claim 1, wherein the first protection MOSFET is a first nMOSFET, and the predetermined voltage source is a ground potential.

3. The electrostatic protection circuit according to claim 2, wherein a number of diodes comprising the first diode array and a value of the first resistor are set, so that the first nMOSFET is off when a voltage at the input/output terminal is between the ground potential and a supply voltage, and the first nMOSFET is on when the voltage at the input/output terminal exceeds the supply voltage.

4. The electrostatic protection circuit according to claim 3, wherein the first resistor is a second nMOSFET set to an off state.

5. The electrostatic protection circuit according to claim 2, further comprising a second resistor connected in parallel with the first diode array between the gate of the first nMOSFET and the input/output terminal.

6. The electrostatic protection circuit according to claim 5, wherein:
   a value of the first resistor and a value of the second resistor are set so that the first nMOSFET is off when a voltage at the input/output terminal is between the ground potential and a supply voltage; and
   a number of diodes comprising the first diode array and a value of the first resistor are set so that the first nMOSFET is on when the voltage at the input/output terminal exceeds the supply voltage.

7. The electrostatic protection circuit according to claim 6, wherein:
   the first resistor is a second nMOSFET set to an off state; and
   the second resistor is a third nMOSFET set to an off state.

8. The electrostatic protection circuit according to claim 5, further comprising:
   a second protection MOSFET comprising a drain connected to the input/output terminal, a source and a substrate connected to a supply voltage;
   a second diode array comprising at least one diode and connected in series in a forward direction between a gate of the second protection MOSFET and the input/output terminal;
   a third resistor connected between the gate of the second protection MOSFET and the supply voltage; and
   a fourth resistor connected in parallel with the second diode array between the gate of the second protection MOSFET and the input/output terminal.

9. The electrostatic protection circuit according to claim 8, wherein the second protection MOSFET is a first pMOSFET.

10. The electrostatic protection circuit according to claim 9, wherein:
   a value of the first resistor and a value of the second resistor are set so that the first nMOSFET is off when a voltage at the input/output terminal is between the ground potential and the supply voltage;
   a number of diodes comprising the first diode array and a value of the first resistor are set so that the first nMOSFET is on when the voltage of the input/output terminal exceeds the supply voltage;
   a value of the third resistor and a value of the fourth resistor are set so that the first pMOSFET is off when the voltage at the input/output terminal is between the ground potential and the supply voltage; and
   a number of diodes comprising the second diode array and the value of the third resistor are set so that the first pMOSFET is on when the voltage at the input/output terminal is less than the ground potential.

11. The electrostatic protection circuit according to claim 10, wherein:
   the first resistor is a second nMOSFET set to an off state;
   the second resistor is a third nMOSFET set to an off state;
   the third resistor is a second pMOSFET set to an off state; and
   the fourth resistor is a third pMOSFET set to an off state.

12. The electrostatic protection circuit according to claim 2, further comprising:
   a second protection MOSFET comprising a drain connected to the input/output terminal, and a source and a substrate connected to a supply voltage;
   a second diode array comprising at least one diode and connected in series in a forward direction between a gate of the second protection MOSFET and the input/output terminal; and
   a second resistor connected between the gate of the second protection MOSFET and the supply voltage.

13. The electrostatic protection circuit according to claim 12, wherein the second protection MOSFET is a first pMOSFET.

14. The electrostatic protection circuit according to claim 13, wherein:
   a number of diodes comprising the first diode array and a value of the first resistor are set so that the first nMOSFET is off when a voltage at the input/output terminal is between the ground potential and a supply voltage, and the first nMOSFET is on when a voltage at the input/output terminal exceeds the supply voltage; and
   a number of diodes comprising in the second diode array and a value of the second resistor are set so that the first pMOSFET is off when the voltage at the input/output terminal is between the ground potential and the supply voltage, and the first pMOSFET is on when the voltage at the input/output terminal is less than the ground potential.

15. The electrostatic protection circuit according to claim 13, wherein:
   the first resistor is a second nMOSFET set to an off state; and
   the second resistor is a third nMOSFET set to an off state.

16. The electrostatic protection circuit according to claim 1,
   wherein the first protection MOSFET is a first pMOSFET and the predetermined voltage is a supply voltage.

17. The electrostatic protection circuit according to claim 16,
   wherein a number of diodes comprising the first diode array and a value of the first resistor are set so that the first pMOSFET is off when a voltage at the input/output terminal is between ground potential and the supply voltage, and the first pMOSFET is on when the voltage at the input/output terminal is less than the ground potential.

18. The electrostatic protection circuit according to claim 17, wherein the first resistor is a second pMOSFET set to an off state.

19. The electrostatic protection circuit according to claim 16, further comprising a second resistor connected in parallel with the first diode array between the gate of the first pMOSFET and the input/output terminal.

20. The electrostatic protection circuit according to claim 19, wherein:
   a value of the first resistor and a value of the second resistor are set so that the first pMOSFET is off when a voltage at the input/output terminal is between a ground potential and the supply voltage; and
   a number of diodes comprising the first diode array and a value of the first resistor are set so that the first pMOSFET is on when the voltage of the input/output terminal is less than the ground potential.

21. The electrostatic protection circuit according to claim 19, wherein:
   the first resistor is a second pMOSFET set to an off state; and
   the second resistor is a third pMOSFET set to an off state.

22. The electrostatic protection circuit according to claim 16, further comprising:
   a second protection MOSFET comprising a drain connected to the input/output terminal and a source and a substrate connected to a ground potential;
   a second diode array comprising at least one diode and connected in series in a forward direction between a gate of the second protection MOSFET and the input/output terminal;
   a third resistor connected in parallel with the second diode array between the gate of the second protection MOSFET and the input/output terminal; and
   a fourth resistor connected between the gate of the second protection MOSFET and a ground potential.

23. An electrostatic protection circuit, comprising:
   a protection MOSFET comprising a drain connected to an input/output terminal, and a source and a gate connected to a predetermined voltage;
   a diode array comprising at least one diode and connected in series in a forward direction between a substrate of the protection MOSFET and the input/output terminal; and
   a resistor connected between the substrate of the protection MOSFET and a ground potential.

24. The electrostatic protection circuit according to claim 23, wherein the protection MOSFET is a protection nMOSFET, and the predetermined voltage is a ground potential.

25. The electrostatic protection circuit according to claim 23, wherein the protection MOSFET is a protection pMOSFET, and the predetermined voltage is a supply voltage.

26. An electrostatic protection circuit, comprising:
- a first protection MOSFET comprising a drain connected to an input/output terminal, and a source and a gate connected to a predetermined voltage source;
- a first diode array comprising at least one diode and connected in series in a forward direction between a substrate of the first protection MOSFET and the input/output terminal; and
- a first resistor connected between the substrate of the first protection MOSFET and the predetermined voltage source.

27. The electrostatic protection circuit according to claim 26, wherein the first protection MOSFET is a first nMOSFET, and the predetermined voltage source is a ground potential.

28. The electrostatic protection circuit according to claim 27, wherein a number of diodes comprising the first diode array and a value of the first resistor are set, so that the first nMOSFET is off when a voltage at the input/output terminal is between the ground potential and a supply voltage, and a current flows from the substrate of the first nMOSFET to the source of the first nMOSFET when the voltage at the input/output terminal exceeds the supply voltage.

29. The electrostatic protection circuit according to claim 28, wherein the first resistor is a second nMOSFET set to an off state.

30. The electrostatic protection circuit according to claim 27, further comprising a second resistor connected in parallel with the first diode array between the substrate of the first nMOSFET and the input/output terminal.

31. The electrostatic protection circuit according to claim 30, wherein:
- a value of the first resistor and a value of the second resistor are set so that the first nMOSFET is off when a voltage at the input/output terminal is between the ground potential and a supply voltage; and
- a number of diodes comprising the first diode array and a value of the first resistor are set so that a current flows from the substrate of the first nMOSFET to the source of the first nMOSFET when the voltage at the input/output terminal exceeds the supply voltage.

32. The electrostatic protection circuit according to claim 31, wherein:
- the first resistor is a second nMOSFET set to an off state; and
- the second resistor is a third nMOSFET set to an off state.

33. The electrostatic protection circuit according to claim 30, further comprising:
- a second protection MOSFET comprising a drain connected to the input/output terminal, a source and a gate connected to a supply voltage;
- a second diode array comprising at least one diode and connected in series in a forward direction between a substrate of the second protection MOSFET and the input/output terminal;
- a third resistor connected between the substrate of the second protection MOSFET and the supply voltage; and
- a fourth resistor connected in parallel with the second diode array between the substrate of the second protection MOSFET and the input/output terminal.

34. The electrostatic protection circuit according to claim 33, wherein the second protection MOSFET is a first pMOSFET.

35. The electrostatic protection circuit according to claim 34, wherein:
- a value of the first resistor and a value of the second resistor are set so that the first nMOSFET is off when a voltage at the input/output terminal is between the ground potential and the supply voltage;
- a number of diodes comprising the first diode array and a value of the first resistor are set so that a current flows from the substrate of the first nMOSFET to the source of the first nMOSFET when the voltage of the input/output terminal exceeds the supply voltage;
- a value of the third resistor and a value of the fourth resistor are set so that the first pMOSFET is off when the voltage at the input/output terminal is between the ground potential and the supply voltage; and
- a number of diodes comprising the second diode array and the value of the third resistor are set so that the a current flows from the source of the first pMOSFET to the substrate of the first pMOSFET when the voltage at the input/output terminal is less than the ground potential.

36. The electrostatic protection circuit according to claim 35, wherein:
- the first resistor is a second nMOSFET set to an off state;
- the second resistor is a third nMOSFET set to an off state;
- the third resistor is a second pMOSFET set to an off state; and
- the fourth resistor is a third pMOSFET set to an off state.

37. The electrostatic protection circuit according to claim 27, further comprising:
- a second protection MOSFET comprising a drain connected to the input/output terminal, and a source and a gate connected to a supply voltage;
- a second diode array comprising at least one diode and connected in series in a forward direction between a substrate of the second protection MOSFET and the input/output terminal; and
- a second resistor connected between the substrate of the second protection MOSFET and the supply voltage.

38. The electrostatic protection circuit according to claim 37, wherein the second protection MOSFET is a first pMOSFET.

39. The electrostatic protection circuit according to claim 38, wherein:
- a number of diodes comprising the first diode array and a value of the first resistor are set so that the first nMOSFET is off when a voltage at the input/output terminal is between the ground potential and a supply voltage, and a current flows from the substrate of the first nMOSFET to the source of the first nMOSFET when a voltage at the input/output terminal exceeds the supply voltage; and
- a number of diodes comprising in the second diode array and a value of the second resistor are set so that the first pMOSFET is off when the voltage at the input/output terminal is between the ground potential and the supply voltage, and a current flows from the source of the first pMOSFET to the substrate of the first pMOSFET when the voltage at the input/output terminal is less than the ground potential.

40. The electrostatic protection circuit according to claim 38, wherein:
- the first resistor is a second nMOSFET set to an off state; and
- the second resistor is a third nMOSFET set to an off state.

41. The electrostatic protection circuit according to claim 26, wherein the first protection MOSFET is a first pMOSFET and the predetermined voltage is a supply voltage.

42. The electrostatic protection circuit according to claim 41,
wherein a number of diodes comprising the first diode array and a value of the first resistor are set so that the first pMOSFET is off when a voltage at the input/output terminal is between ground potential and the supply voltage, and a current flows from the source of the first pMOSFET to the substrate of the first pMOSFET when the voltage at the input/output terminal is less than the ground potential.

43. The electrostatic protection circuit according to claim 42, wherein the first resistor is a second pMOSFET set to an off state.

44. The electrostatic protection circuit according to claim 41, further comprising a second resistor connected in parallel with the first diode array between the substrate of the first pMOSFET and the input/output terminal.

45. The electrostatic protection circuit according to claim 44, wherein:
a value of the first resistor and a value of the second resistor are set so that the first pMOSFET is off when a voltage at the input/output terminal is between a ground potential and the supply voltage; and
a number of diodes comprising the first diode array and a value of the first resistor are set so that a current flows from the source of the first pMOSFET to the substrate of the first pMOSFET when the voltage of the input/output terminal is less than the ground potential.

46. The electrostatic protection circuit according to claim 44, wherein:
the first resistor is a second pMOSFET set to an off state; and
the second resistor is a third pMOSFET set to an off state.

47. The electrostatic protection circuit according to claim 41, further comprising:
a second protection MOSFET comprising a drain connected to the input/output terminal and a source and a gate connected to a ground potential;
a second diode array comprising at least one diode and connected in series in a forward direction between a substrate of the second protection MOSFET and the input/output terminal;
a third resistor connected in parallel with the second diode array between the substrate of the second protection MOSFET and the input/output terminal; and
a fourth resistor connected between the substrate of the second protection MOSFET and a ground potential.

* * * * *

UNITED STATES PATENT AND TRADEMARK OFFICE
CERTIFICATE OF CORRECTION

PATENT NO. : 6,507,469 B2  
DATED : January 14, 2003  
INVENTOR(S) : Takeshi Andoh It is certified that error appears in the above-identified patent and that said Letters Patent is hereby corrected as shown below:

Column 7,  
Line 31, delete "$R_{n1}$" insert -- $R_{p1}$ --  
Line 33, delete "$Q_{rn1}$" after "with pMOSFET" insert -- $Q_{rp1}$ --  
Line 33, after the "pMOSFET" delete "$Q_{rn1}$" insert -- $Q_{rp1}$ --

Column 9,  
Line 26, delete "$4x10^{12}cm$" insert -- $4x10^{12}cm^{-2}$ --  
Line 33, delete "n diffusion" insert -- n⁻ diffusion --

Column 10,  
Line 25, delete "pMOSFET $Q_{rn1}$" insert -- pMOSFET $Q_{rp1}$ --  
Line 34, delete "pMOSFET $Q_{p1}$" insert -- pMOSFET $Q_{rp1}$ --  
Line 59, delete "nMOSFET $Q_n$" insert -- nMOSFET $Q_{n2}$ --

Column 14,  
Line 34, delete "$V_{t1}$" insert -- $V_{t1'}$ --

Column 16,  
Line 24, delete "$3x10^{15}cm_{-2}$" insert -- $3x10^{15}cm^{-2}$ --

Column 17,  
Line 14, delete "pMOSFET $Q_{p3}$" insert -- pMOSFET $Q_{rp3}$ --

Column 19,  
Line 14, delete "nMOSFET $Q_{rn}$" insert -- pMOSFET" $Q_{rn5}$ --

Signed and Sealed this

Sixteenth Day of December, 2003

JAMES E. ROGAN  
*Director of the United States Patent and Trademark Office*